US012645145B2

(12) United States Patent
Chang et al.

(10) Patent No.: US 12,645,145 B2
(45) Date of Patent: Jun. 2, 2026

(54) ADDITIVE FOR LITHOGRAPHY

(71) Applicant: TAIWAN SEMICONDUCTOR MANUFACTURING COMPANY, LTD., Hsinchu (TW)

(72) Inventors: Ching-Yu Chang, Yilang County (TW); An-Ren Zi, Hsinchu City (TW); Yuan Chih Lo, Hsinchu City (TW); Shi-Cheng Wang, Tainan City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 381 days.

(21) Appl. No.: 18/300,859

(22) Filed: Apr. 14, 2023

(65) Prior Publication Data

US 2024/0345485 A1 Oct. 17, 2024

(51) Int. Cl.

| | |
|---|---|
| ***G03F 7/38*** | (2006.01) |
| ***G03F 7/004*** | (2006.01) |
| ***H10P 50/00*** | (2026.01) |
| ***H10P 76/20*** | (2026.01) |

(52) U.S. Cl.

CPC .............. *G03F 7/38* (2013.01); *G03F 7/0042* (2013.01); *H10P 50/71* (2026.01); *H10P 50/73* (2026.01); *H10P 76/2041* (2026.01)

(58) Field of Classification Search

CPC .......... G03F 7/38; G03F 7/0042; G03F 7/004; G03F 7/0045; G03F 7/0397; G03F 7/70425; H01L 21/0274; H01L 21/31144; H01L 21/32139

See application file for complete search history.

(56) References Cited

U.S. PATENT DOCUMENTS

| | | | |
|---|---|---|---|
| 8,764,995 | B2 | 7/2014 | Chang et al. |
| 8,796,666 | B1 | 8/2014 | Huang et al. |
| 8,828,625 | B2 | 9/2014 | Lu et al. |
| 8,841,047 | B2 | 9/2014 | Yu et al. |
| 8,877,409 | B2 | 11/2014 | Hsu et al. |
| 9,012,132 | B2 | 4/2015 | Chang |
| 9,028,915 | B2 | 5/2015 | Chang et al. |
| 9,093,530 | B2 | 7/2015 | Huang et al. |
| 9,146,469 | B2 | 9/2015 | Liu et al. |
| 9,184,054 | B1 | 11/2015 | Huang et al. |
| 9,213,234 | B2 | 12/2015 | Chang |
| 9,223,220 | B2 | 12/2015 | Chang |
| 9,256,123 | B2 | 2/2016 | Shih et al. |
| 9,256,133 | B2 | 2/2016 | Chang |
| 9,529,268 | B2 | 12/2016 | Chang et al. |
| 9,536,759 | B2 | 1/2017 | Yang et al. |
| 9,548,303 | B2 | 1/2017 | Lee et al. |

(Continued)

FOREIGN PATENT DOCUMENTS

| | | | |
|---|---|---|---|
| TW | 201443566 | A | 11/2014 |
| TW | 201930323 | A | 8/2019 |

*Primary Examiner* — Duy Vu N Deo

(74) *Attorney, Agent, or Firm* — Birch, Stewart, Kolasch & Birch, LLP

(57) ABSTRACT

A method includes the following steps. A target layer is formed on a substrate. A resist layer is formed on the target layer. The resist layer is exposed such that secondary electrons are produced in the resist layer. The secondary electrons are terminated using an additive. The resist layer is developed. The target layer is etched using the developed resist layer as a mask.

20 Claims, 24 Drawing Sheets

(56) References Cited

U.S. PATENT DOCUMENTS

| | | | | |
|---|---|---|---|---|
| 2015/0159123 | A1* | 6/2015 | Klipp | G03F 7/322 510/176 |
| 2016/0041465 | A1* | 2/2016 | Takizawa | C08F 12/22 430/311 |
| 2018/0173096 | A1* | 6/2018 | Zi | G03F 7/0047 |
| 2019/0384170 | A1* | 12/2019 | Zi | G03F 7/162 |

* cited by examiner

400

ADDITIVE FOR LITHOGRAPHY

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy that has itself been patterned. Such an exposure modifies the chemical and physical properties of the exposed regions of the photosensitive material. This modification, along with the lack of reducing an Extreme ultraviolet (EUV) dose to develop a pattern in the photoresist and reducing a line width roughness (LWR) of the pattern on in regions of the photosensitive material that were not exposed, can be exploited to remove one region without removing the other.

However, as the size of individual devices has decreased, process windows for photolithographic processing has become tighter and tighter. As such, advances in the field of photolithographic processing are necessary to maintain the ability to scale down the devices, and further improvements are needed in order to meet the desired design criteria such that the march towards smaller and smaller components may be maintained.

As the semiconductor industry has progressed into nanometer technology process nodes in pursuit of higher device density, higher performance, and lower costs, there have been challenges in reducing semiconductor feature size. Extreme ultraviolet lithography (EUVL) has been developed to form smaller semiconductor device feature size and increase device density on a semiconductor wafer. In order to improve EUVL an increase in wafer exposure throughput is desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Figure 1A:
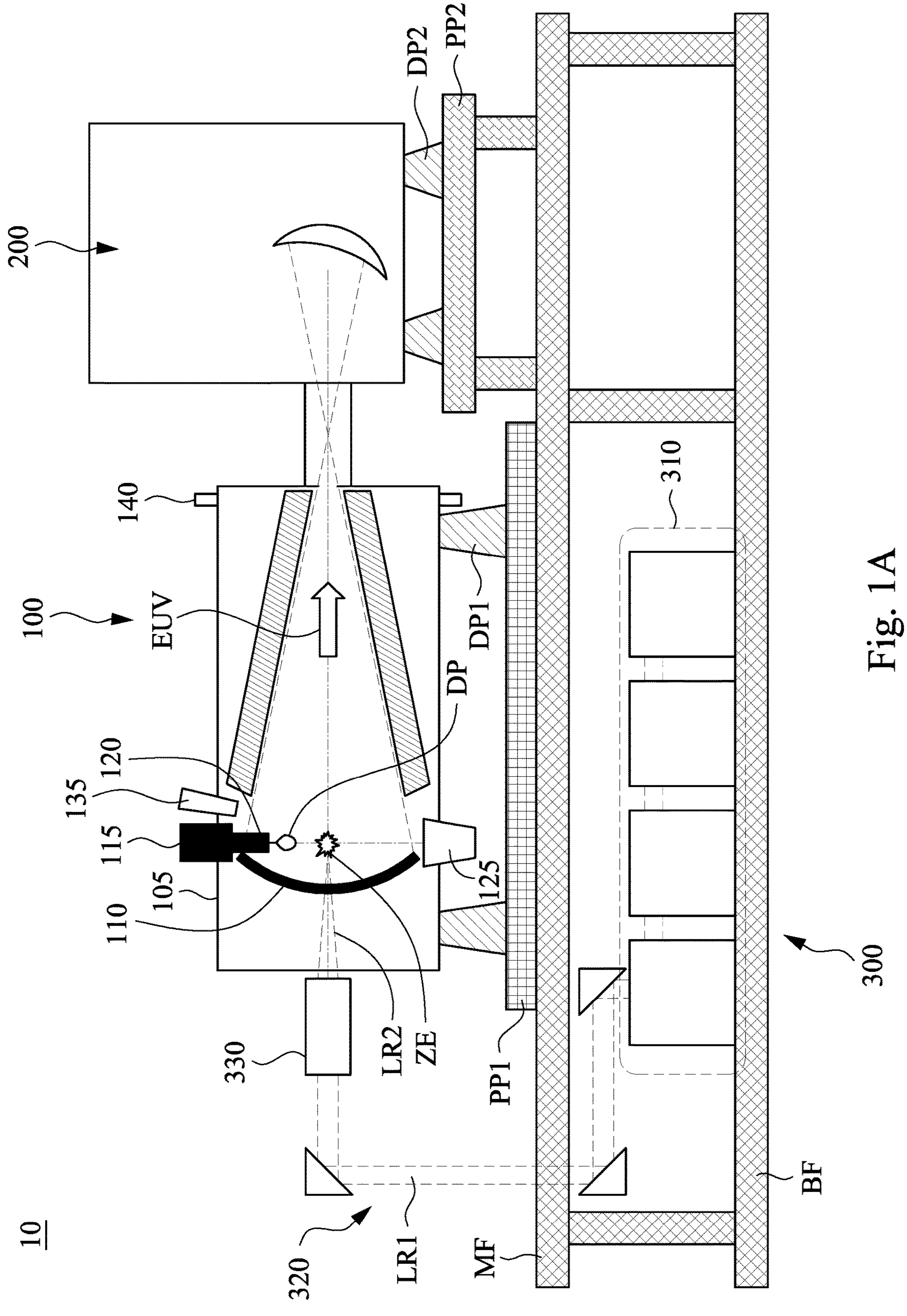
FIG. 1A is a schematic view of an EUV lithography tool with an LPP-based EUV radiation source, in accordance with some embodiments of the present disclosure.

FIG. 1A is a schematic view diagram of an Extreme ultraviolet (EUV) lithography system 10, constructed in accordance with some embodiments. The EUV lithography system 10 may also be generically referred to as a scanner that is configured to perform lithography exposure processes with respective radiation source and exposure mode. The EUV lithography system 10 is designed to expose a photoresist layer by EUV light or EUV radiation. The photoresist layer is a material sensitive to the EUV light. The EUV lithography system 10 employs a radiation source 100 to generate EUV light, such as EUV light having a wavelength ranging between about 1 nm and about 100 nm. In one particular example, the radiation source 100 generates a EUV light with a wavelength centered at about 13.5 nm. Accordingly, the radiation source 100 is also referred to as EUV radiation source 100.

Extreme ultraviolet (EUV) lithography has become widely used due to its ability to achieve small semiconductor device sizes, for example for 20 nanometer (nm) technology nodes. During photoresist exposure, EUV radiation is absorbed in the resist and in the substrate below, producing highly energetic photoelectrons (about 100 eV) and in turn a cascade of low-energy secondary electrons that diffuse laterally by several nanometers. Secondary electrons (SEs) are electrons with energy less than 50 eV, such as in a range from 1 eV to 10 eV. These electrons increase the extent of chemical reactions in the resist which increases its EUV dose sensitivity. However, a secondary electron pattern that is random in nature is superimposed on the optical image. This unwanted secondary electron exposure results in loss of contrast in the patterned resist.

Compared to conventional chemically amplified resists, which is an insulator, a metal in metallic resists is less susceptible to secondary electron exposure effects since the secondary electrons can quickly lose energy and thermalize by scattering with conduction electrons.

Yet in spite of these advantages for metallic resists, metallic resists used in current EUV lithography are still not satisfactory in every aspect. Because flare, which is also called the stray light, is an important effect impacting EUVL imaging system performance. The flare is due to light scattered from contamination, multiple reflections, lens inhomogeneity and surface roughness. The flare allows an unexposed region to produce unwanted secondary electrons, resulting in a loss of contrast for the patterned resist. This defect is replicated in the material to be patterned during subsequent pattern transfer etching.

The present disclosure provides a novel additive for lithography using metallic resists. The additive is beneficial to terminate the secondary electrons in an unexposed region, and thus enhance the contrast.

The various aspects of the present disclosure will be discussed below in greater detail with reference to FIGS. 1A-13. First, an EUV lithography system will be discussed below with reference to FIGS. 1A, 1B and 2. Next, the details of the novel additive and the lithography process employing the additive will be discussed with reference to FIGS. 3-13.

The advanced lithography process, method, and materials described in the current disclosure can be used in many applications, including fin-type field effect transistors (FinFETs), gate-all-around (GAA) FETs. For example, the fins may be patterned to produce a relatively close spacing between features, for which the above disclosure is well suited. In addition, spacers used in forming fins of FinFETs can be processed according to the above disclosure.

To address the trend of the Moore's law for decreasing size of chip components and the demand of higher computing power chips for mobile electronic devices such as smart phones with computer functions, multi-tasking capabilities, or even with workstation power. Smaller wavelength photolithography exposure systems are desirable. Extreme ultraviolet (EUV) photolithography technique uses an EUV radiation source to emit an EUV light ray with wavelength of about 13.5 nm. Because this wavelength is also in the x-ray radiation wavelength region, the EUV radiation source is also called a soft x-ray radiation source. The EUV light rays emitted from a laser-produced plasma (LPP) are collected by a collector mirror and reflected toward a patterned mask.

FIG. 1A is a schematic view of an EUV lithography tool with an LPP-based EUV radiation source, in accordance with some embodiments of the present disclosure. The EUV lithography system includes an EUV radiation source 100 to generate EUV radiation, an exposure device 200, such as a scanner, and an excitation laser source 300. As shown in FIG. 1A, in some embodiments, the EUV radiation source 100 and the exposure device 200 are installed on a main floor MF of a clean room, while the excitation laser source 300 is installed in a base floor BF located under the main floor MF. Each of the EUV radiation source 100 and the exposure device 200 are placed over pedestal plates PP1 and PP2 via dampers DP1 and DP2, respectively. The EUV radiation source 100 and the exposure device 200 are coupled to each other by a coupling mechanism, which may include a focusing unit.

The EUV lithography tool is designed to expose a resist layer to EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask.

Figure 1B:
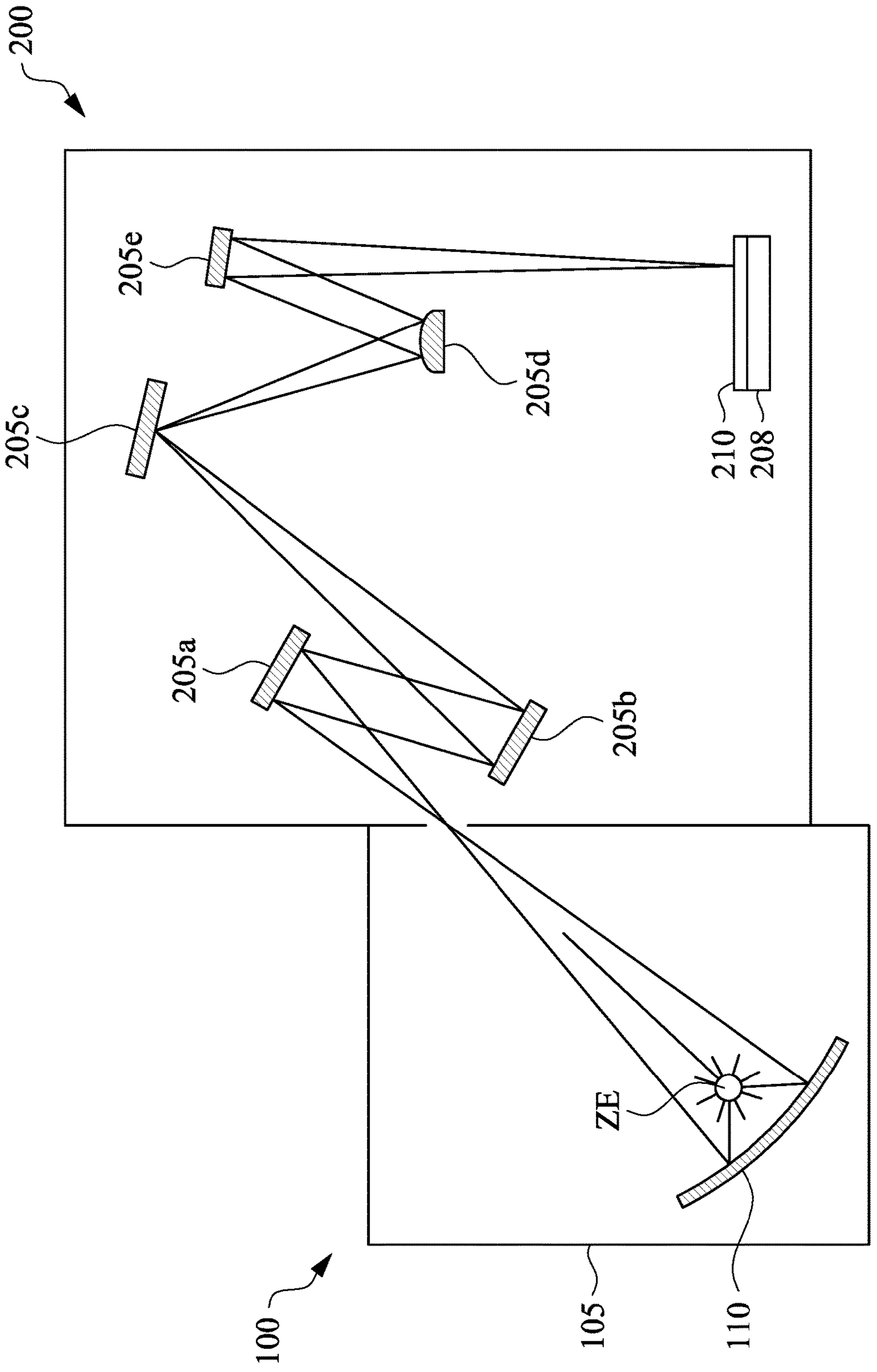
FIG. 1B is a simplified schematic diagram of a detail of an extreme ultraviolet lithography tool according to an embodiment of the disclosure showing the exposure of photoresist coated substrate with a patterned beam of EUV light.

FIG. 1B is a simplified schematic diagram of a detail of an extreme ultraviolet lithography tool according to an embodiment of the disclosure showing the exposure of photoresist coated substrate 210 secured on a substrate stage 208 of the exposure device 200 with a patterned beam of EUV light. The exposure device 200 is an integrated circuit lithography tool such as a stepper, scanner, step and scan system, direct write system, device using a contact and/or proximity mask, etc., provided with one or more optics 205*a*, 205*b*, for example, to illuminate a patterning optic 205*c*, such as a reticle, with a beam of EUV light, to produce a patterned beam, and one or more reduction projection optics 205*d*, 205*e*, for projecting the patterned beam onto the photoresist coated substrate 210. A mechanical assembly (not shown) may be provided for generating a controlled relative movement between the photoresist coated substrate 210 and the patterning optic 205*c*. As further shown in FIG. 2, the EUVL tool includes an EUV radiation source 100 including an EUV light radiator ZE emitting EUV light in a chamber 105 that is reflected by a collector 110 along a path into the exposure device 200 to irradiate the photoresist coated substrate 210.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gradings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic", as used herein, is directed to, but not limited to, components which operate solely or to advantage within one or more specific wavelength range(s) such as at the EUV output light wavelength, the irradiation laser wavelength, a wavelength suitable for metrology or any other specific wavelength.

In various embodiments of the present disclosure, the photoresist coated substrate 210 is a semiconductor wafer, such as a silicon wafer or other type of wafer to be patterned. The EUVL tool further includes other modules or is integrated with (or coupled with) other modules in some embodiments.

As shown in FIG. 1A, the EUV radiation source 100 includes a target droplet generator 115 and a collector 110, enclosed by a chamber 105. For example, the collector 110 is a laser-produced plasma (LPP) collector. In various embodiments, the target droplet generator 115 includes a reservoir to hold a source material and a nozzle 120 through which target droplets DP of the source material are supplied into the chamber 105.

In some embodiments, the target droplets DP are metal droplets of tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, having a diameter of about 10 μm to about 100 μm. In other embodiments, the target droplets DP are tin droplets having a diameter of about 25 μm to about 50 μm. In some embodiments, the target droplets DP are supplied through the nozzle 120 at a rate in a range from about 50 droplets per second (i.e., an ejection-frequency of about 50 Hz) to about 50,000 droplets per second (i.e., an ejection-frequency of about 50 kHz).

Referring back to FIG. 1A, an excitation laser LR2 generated by the excitation laser source 300 is a pulse laser. The laser pulses LR2 are generated by the excitation laser source 300. The excitation laser source 300 may include a laser generator 310, laser guide optics 320 and a focusing apparatus 330. In some embodiments, the laser generator 310 includes a carbon dioxide ($CO_2$) or a neodymium-doped yttrium aluminum garnet (Nd:YAG) laser source with a wavelength in the infrared region of the electromagnetic spectrum. For example, the laser generator 310 has a wavelength of about 9.4 μm or about 10.6 μm, in an embodiment. The laser light LR1 generated by the laser generator 310 is guided by the laser guide optics 320 and focused into the excitation laser LR2 by the focusing apparatus 330, and then introduced into the EUV radiation source 100.

In some embodiments, the excitation laser LR2 includes a pre-heat laser and a main laser. In such embodiments, the pre-heat laser pulse (interchangeably referred to herein as the "pre-pulse") is used to heat (or pre-heat) a given target droplet to create a low-density target plume with multiple smaller droplets, which is subsequently heated (or reheated) by a pulse from the main laser, generating increased emission of EUV light.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with (e.g., synchronized with) the ejection-frequency of the target droplets DP in an embodiment.

The excitation laser LR2 is directed through windows (or lenses) into the zone of excitation ZE in front of the collector 110. The windows are made of a suitable material substantially transparent to the laser beams. The generation of the pulse lasers is synchronized with the ejection of the target droplets DP through the nozzle 120. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation EUV, which is collected by the collector 110. The collector 110 further reflects and focuses the EUV radiation for the lithography exposing processes performed through the exposure device 200. The droplet catcher 125 is used for catching excessive target droplets. For example, some target droplets may be purposely missed by the laser pulses.

In some embodiments, the collector 110 is designed with a proper coating material and shape to function as a mirror for EUV collection, reflection, and focusing. In some embodiments, the collector 110 is designed to have an ellipsoidal geometry. In some embodiments, the coating material of the collector 110 is similar to the reflective multilayer of the EUV mask. In some examples, the coating material of the collector 110 includes a ML (such as a plurality of Mo/Si film pairs) and may further include a capping layer (such as Ru) coated on the ML to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern.

In the present disclosure, the terms mask, photomask, and reticle are used interchangeably. In the present embodiment, the patterning optic 205*c* is a reflective mask 205*c*. The reflective mask 205*c* also includes a reflective ML deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 205*c* may further include a capping layer, such as ruthenium (Ru), disposed on the ML for protection. The mask 205*c* further includes an absorption layer deposited over the ML. The absorption layer is patterned to define a layer of an integrated circuit (IC), the absorber layer is discussed below in greater detail according to various aspects of the present disclosure. Alternatively, another reflective layer may be deposited over the ML and is patterned to define a layer of an integrated circuit, thereby forming a EUV phase shift mask.

The mask 205c and the method making the same are further described in accordance with some embodiments. In some embodiments, the mask fabrication process includes two operations: a blank mask fabrication process and a mask patterning process. During the blank mask fabrication process, a blank mask is formed by deposing suitable layers (e.g., reflective multiple layers) on a suitable substrate. The blank mask is then patterned during the mask patterning process to achieve a desired design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. A set of masks is used to construct a complete IC.

Figure 2:
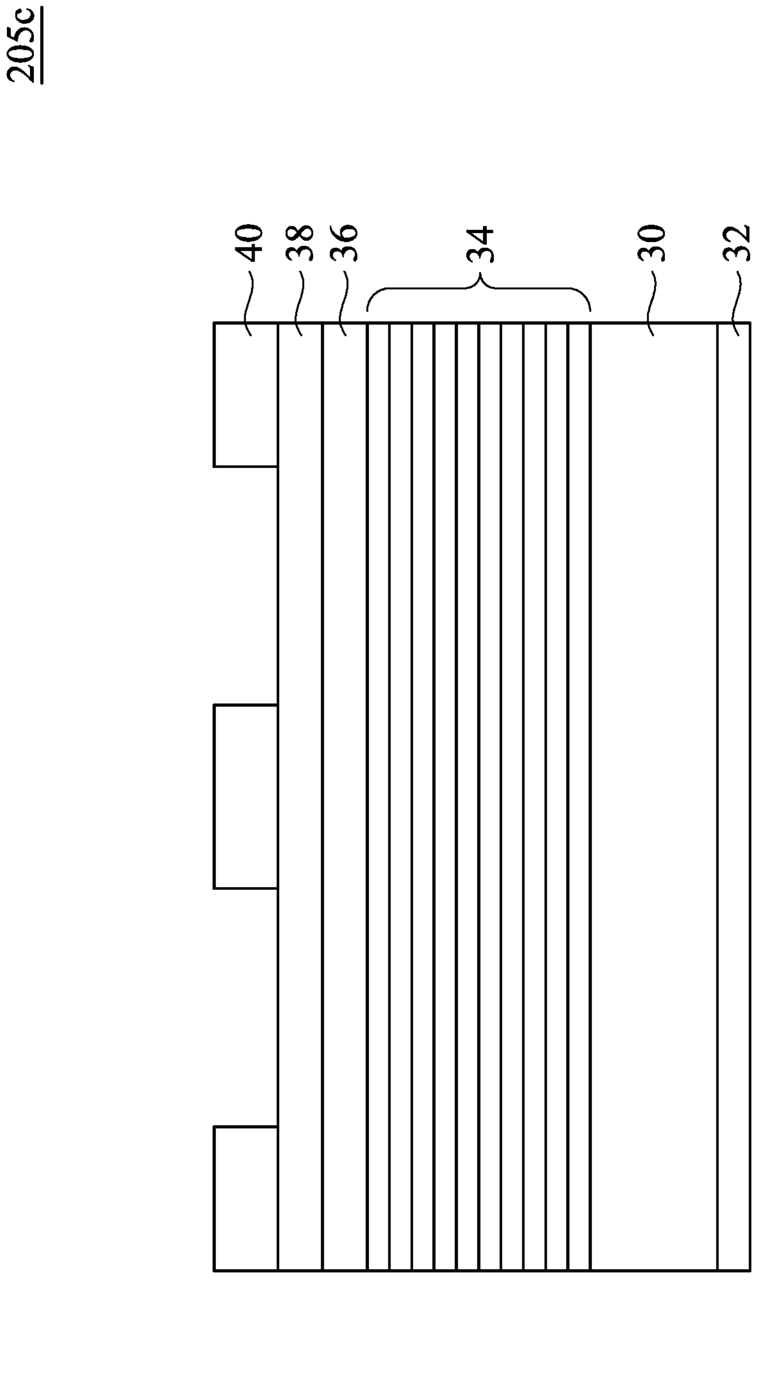
FIG. 2 is a sectional view of a EUV mask constructed in accordance with some embodiments of the present disclosure.

One example of the reflective mask 205c is shown in FIG. 2. The reflective mask 205c in the illustrated embodiment is a EUV mask, and includes a substrate 30 made of a LTEM. The LTEM material may include $TiO_2$ doped $SiO_2$, and/or other low thermal expansion materials known in the art. In some embodiments, a conductive layer 32 is additionally disposed under on the backside of the LTEM substrate 30 for the electrostatic chucking purpose. In one example, the conductive layer 32 includes chromium nitride (CrN), though other suitable compositions are possible.

The reflective mask 205c includes a reflective multilayer (ML) structure 34 disposed over the LTEM substrate 30. The ML structure 34 may be selected such that it provides a high reflectivity to a selected radiation type/wavelength. The ML structure 34 includes a plurality of film pairs, such as Mo/Si film pairs (e.g., a layer of molybdenum above or below a layer of silicon in each film pair). Alternatively, the ML structure 34 may include Mo/Be film pairs, or any materials with refractive index difference being highly reflective at EUV wavelengths.

Still referring to FIG. 2, the EUV mask 205c also includes a capping layer 36 disposed over the ML structure 34 to prevent oxidation of the ML. The EUV mask 205c may further include a buffer layer 38 disposed above the capping layer 36 to serve as an etching-stop layer in a patterning or repairing process of an absorption layer, which will be described later. The buffer layer 38 has different etching characteristics from the absorption layer disposed thereabove. The buffer layer 38 includes ruthenium (Ru), Ru compounds such as RuB, RuSi, chromium (Cr), chromium oxide, and chromium nitride in various examples.

The EUV mask 205c also includes an absorber layer 40 (also referred to as an absorption layer) formed over the buffer layer 38. In some embodiments, the absorber layer 40 absorbs the EUV radiation directed onto the mask. In various embodiments, the absorber layer may be made of tantalum boron nitride (TaBN), tantalum boron oxide (TaBO), or chromium (Cr), Radium (Ra), or a suitable oxide or nitride (or alloy) of one or more of the following materials: Actium, Radium, Tellurium, Zinc, Copper, and Aluminum.

Figure 3A:
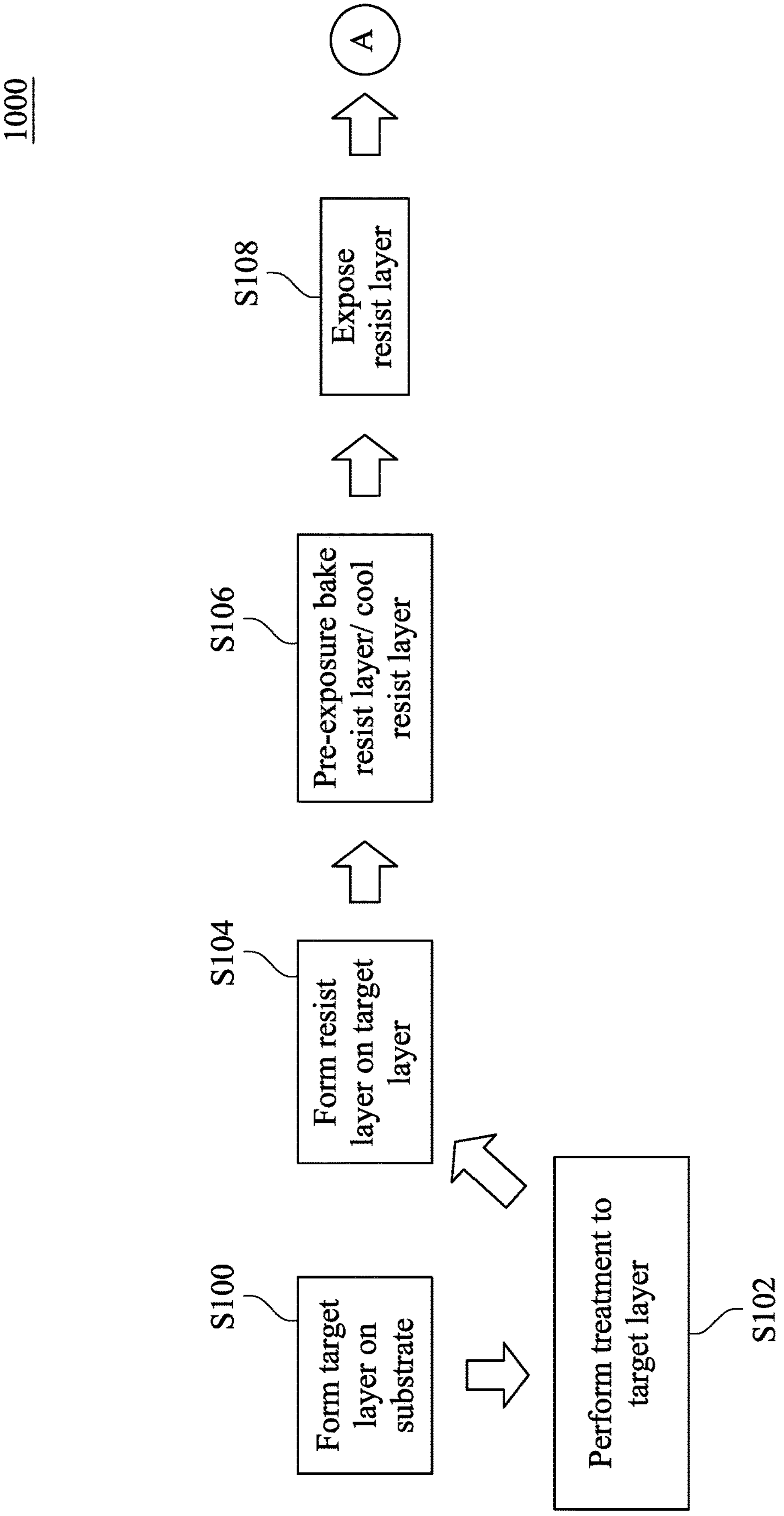
FIGS. 3A-3B illustrates a flowchart of an exemplary method for patterning a target layer in accordance with some embodiments.
Figure 3B:
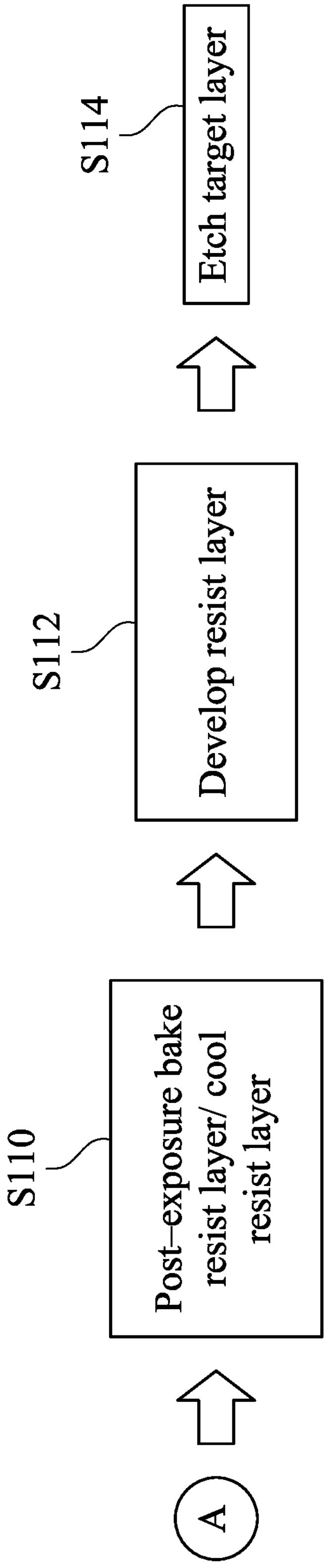

FIGS. 3A-3B illustrates a flowchart of an exemplary method 1000 for patterning a target layer in accordance with some embodiments. The method 1000 includes a relevant part of the entire manufacturing process. It is understood that additional operations may be provided before, during and after the operations shown by FIGS. 3A-3B, and some of the operations described below can be replaced or eliminated for additional embodiments of the method. The order of the operations/processes may be interchangeable. The method includes fabrication of a semiconductor device. However, the fabrication of the semiconductor device is merely an example for describing the manufacturing process according to some embodiments of the present disclosure.

Figure 4:
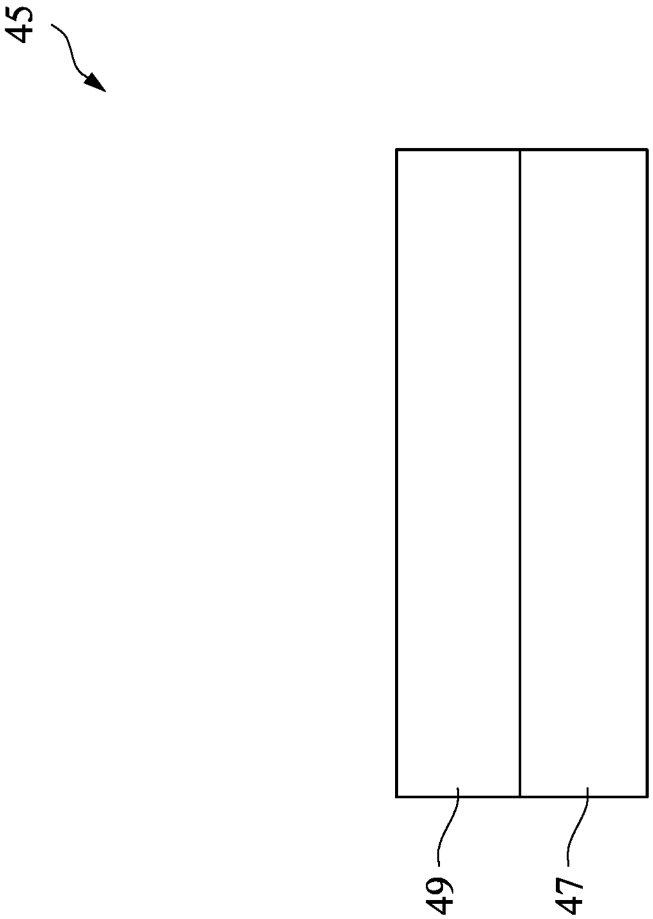
FIGS. 4-6 are diagrammatic fragmentary cross-sectional side views of a semiconductor device at various stages of fabrication in accordance with various aspects of the present disclosure.

FIGS. 4-6 and 8-13 are diagrammatic fragmentary cross-sectional side views of a semiconductor device 45 at various stages of fabrication in accordance with various aspects of the present disclosure. The method 1000 begins at step S100 in which the step S100 includes forming a target layer 49 on a substrate 47. With reference to FIG. 4, in some embodiments of step S100, a target layer to be patterned is formed on a substrate. For example, the target layer may be formed by an acceptable deposition process, such as chemical vapor deposition (CVD), physical vapor deposition (PVD), atomic layer deposition (ALD), spin coating process, or the like. The substrate 47 may include an integrated circuit (IC) chip, system on chip (SoC), or portion thereof, and may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistor.

In some embodiments, the substrate 47 is a silicon substrate doped with a p-type dopant such as boron (for example a p-type substrate). Alternatively, the substrate 47 could be another suitable semiconductor material. For example, the substrate 47 may be a silicon substrate that is doped with an n-type dopant such as phosphorous or arsenic (an n-type substrate). The substrate 47 could include other elementary semiconductors such as germanium and diamond. The substrate 47 could optionally include a compound semiconductor and/or an alloy semiconductor. Further, the substrate 47 could include an epitaxial layer (epi layer), may be strained for performance enhancement, and may include a silicon-on-insulator (SOI) structure.

In some embodiments, the target layer 49 is substantially conductive or semi-conductive. The electrical resistance may be less than about 103 ohm-meter. In some embodiments, the target layer 49 contains metal, metal alloy, or metal nitride/sulfide/selenide/oxide/silicide with the formula MXa, where M is a metal, and X is N, S, Se, O, Si, and where "a" is in a range from about 0.4 to 2.5. For example, the target layer may contain Ti, Al, Co, Ru, TiN, $WN_2$, or TaN.

In some other embodiments, the target layer 49 contains a dielectric material with a dielectric constant in a range from about 1 to about 40. In some other embodiments, the target layer 49 contains Si, metal oxide, or metal nitride, where the formula is $MX_b$, wherein M is a metal or Si, and X is N or O, and wherein "b" is in a range from about 0.4 to 2.5. For example, the target layer 49 may contain $SiO_2$, silicon nitride, aluminum oxide, hafnium oxide, or lanthanum oxide.

Figure 5:
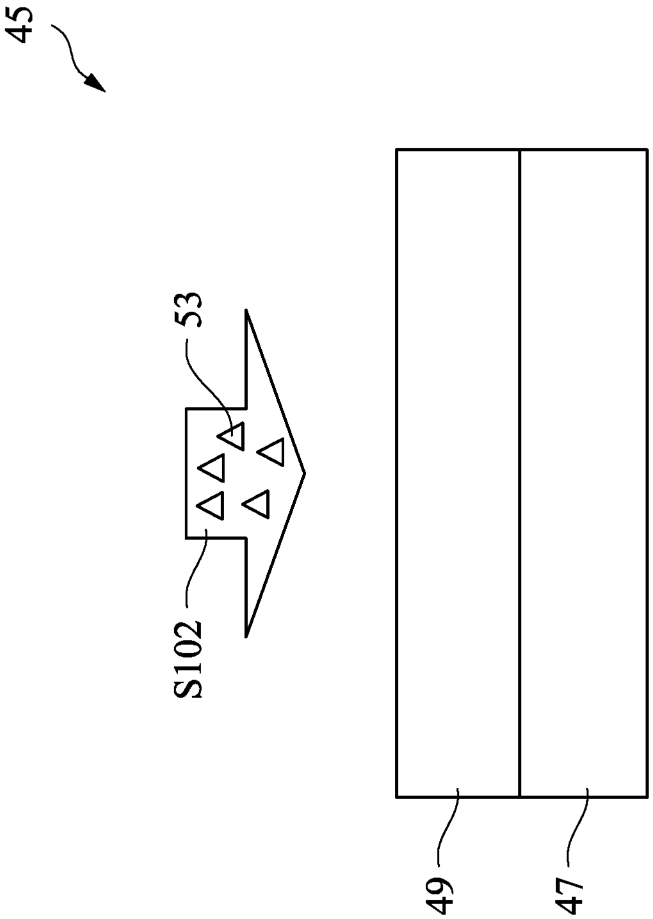

Referring back to FIG. 3A, the method 1000 then proceeds to step S102 where a treatment is performed to the target layer. With reference to FIG. 5, in some embodiments of step S102, a treatment is performed to the target layer 49. The treatment may be performed by applying an additive 53 in gas phase, vapor phase or liquid phase to the target layer 49. The term "gas" refers to a fluid that can be easily squeezed. The term "vapor" refers to the gas phase below the crucial temperature where ether a solid or a liquid can exist at the same time. The additive 53 is beneficial to terminate unwanted secondary electrons 68 (see FIG. 9) in the unexposed region which may be produced by the flare, and thus enhance the contrast. In some embodiments, the additive 53 may include one or more double bonds.

In some embodiments, during performing the treatment, the additive 53 is heated at a temperature greater than a room temperature and lower than 200° C. to increase a reaction efficiency for the reaction between the target layer 49 and the additive 53. In some other embodiments, the semiconductor device 45 is heated to increase the reaction efficiency after performing the treatment. In some embodiments, in the treatment, the semiconductor device 45 is kept at room temperature.

In some embodiments, the additive 53 is Tetracyanoquinodimethane, F4-Tetracyanoquinodimethane, or include the following formulae (A1) to (A6):

Formula (A1)

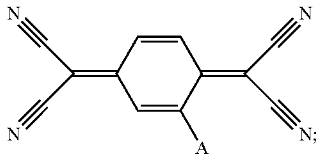

Formula (A2)

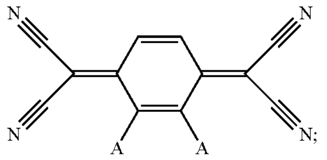

Formula (A3)

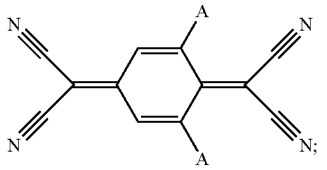

Formula (A4)

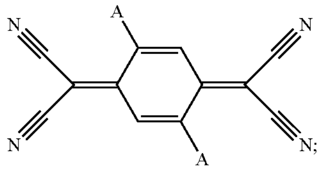

Formula (A5)

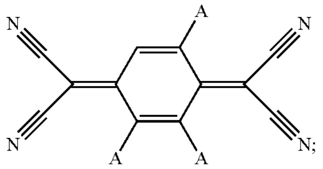

and

Formula (A6)

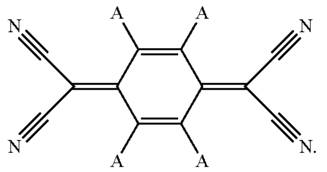

A in the Formulae (A1) to (A6) is H, halogen (such as F, Cl), R, or OR, and in the R and OR, R is composed by unbranched or branched, cyclic or noncyclic saturated 1 to 12 carbon atoms. In some embodiments, the additive 53 can be dissolved in a solvent, forming a mixture. A ratio of the additive 53 to the mixture is in a range from 0.001 weight percentage (wt %) to 100 wt %. In some embodiments where the ratio is 100 wt %, no solvent is added to the additive. The solubility of the additive 53 in the solvent is related to the "A" of the formula (A1) to (A6). For example, by controlling R or OR thereof, the solubility of the additive 53 in the solvent can be tuned. In some embodiments, the solvent may be propylene glycol methyl ether acetate (PGMEA), propylene glycol monomethyl ether (PGME), 1-Ethoxy-2-propanol (PGEE), Gamma-Butyrolactone (GBL), Cyclohexanone (CHN), Ethyl lactate (EL), Methanol, Ethanol, Propanol, n-Butanol, Acetone, Dimethylformamide (DMF), Isopropyl alcohol (IPA), Tetrahydrofuran (THF), Methyl Isobutyl Carbinol (MIBC), n-butyl acetate (nBA), 2-heptanone (MAK), the like or a combination thereof.

In some embodiments, the additive 53 includes a photo acid generator (PAG) including a cation and an anion. In some embodiments, the additive 53 may have one of the following chemical formulae (B1) to (B4):

Formula (B1)

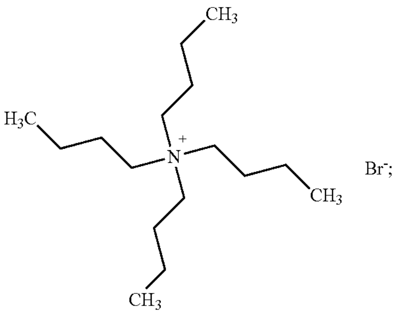

Tetra-n-butylammonium bromide (TBABr)

Formula (B2)

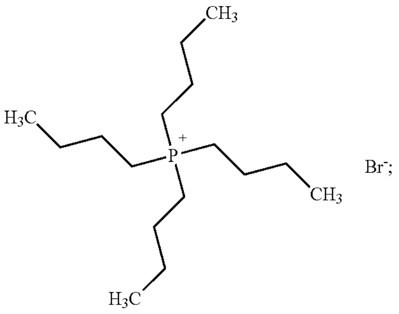

Tetrabutylphosphonium bromide (TBPBr)

Formula (B3)

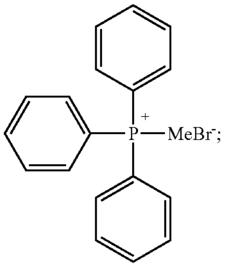

and

Methyltriphenylphosphonium bromide (mTPPBr)

-continued

Formula (B4)

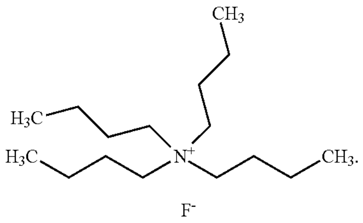

tetra-n-butylammonium fluoride (TABF)

In some embodiments, the additive 53 includes a photo acid generator (PAG) including the cation having one of the following chemical formulae (C1) and (C2):

Formula (C1)

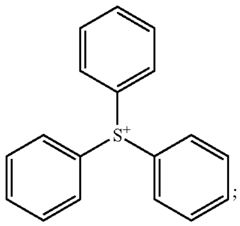

; and

Formula (C2)

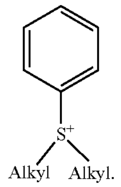

In some embodiments, the additive 53 includes a photo acid generator (PAG) including the anion having one of the following chemical formulae (D1) to (D7):

$C_4F_9SO_3^-$ Formula (D1);

$C_6F_{13}SO_3^-$ Formula (D2);

Formula (D3)

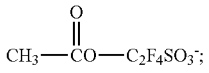

Formula (D4)

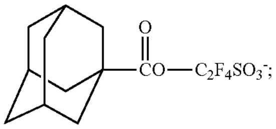

Formula (D5)

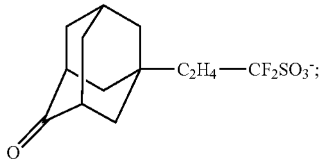

-continued

Formula (D6)

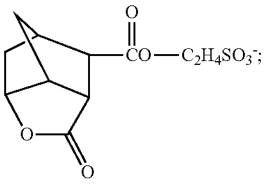

and

Formula (D7)

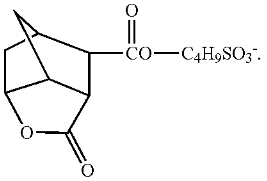

In some embodiments, the additive 53 may be a benzazole compound. For example, the additive 53 may have the following general formula (E1):

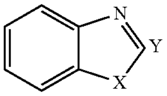

Formula (E1). X in the Formula (E1) could be N, NH or S. Y in the Formula (E1) could be S, O, Se, NH, NR, or R, in which R may be cyclic or noncyclic, saturated or non-saturated 1 to 24 carbon units with hydrogen or halogen. The illustrative examples of the additive 53 may be represented by the following chemical formulae (E2) to (E9):

Formula (E2)

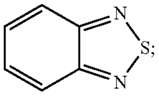

(benzothiadiazole)

Formula (E3)

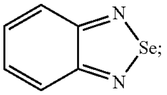

(benzoselenadiazole)

Formula (E4)

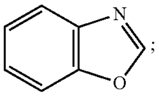

(benzoxazole)

Formula (E5)

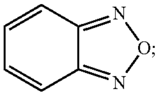

(benzofurazan)

Formula (E6)

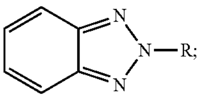

-continued

Formula (E7)

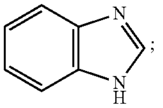

(benzimidazole)

Formula (E8)

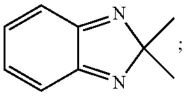

; and

Formula (E9)

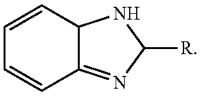

In some embodiments, the additive may be a triazole. The triazole has the following chemical formula (E10):

Formula (E10)

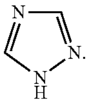

(triazole)

In some embodiments, the additive 53 may be a quinoxaline compound. For example, the additive 53 may have the following chemical formulae (E11) and (E12):

Formula (E11)

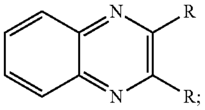

and

Formula (E12)

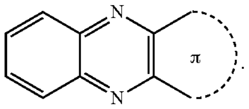

R in the formula (E11) could be cyclic or noncyclic, saturated or non-saturated 1 to 24 carbon units with hydrogen or halogen.

In some embodiments, the additive 53 may have the following chemical formulae (E13) and (E14):

Formula (E13)

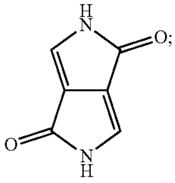

and (diketopyrrolopyrrole)

-continued

Formula (E14)

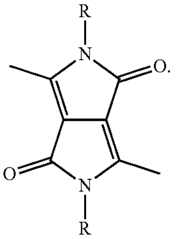

R in the formula (E14) could be cyclic or noncyclic, saturated or non-saturated 1 to 24 carbon units with hydrogen or halogen.

In some embodiments, the additive may be a ketone-based compound. For example, the additive may have the following general chemical formula (F1):

Formula (F1)

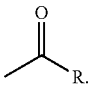

R in the Formula (F1) could be an aliphatic or aromatic group, unbranched or branched, cyclic or noncyclic saturated 3 to 24 carbon atoms. In some embodiments, the additive 53 has one of the following chemical formulae (F2) to (F9):

Formula (F2)

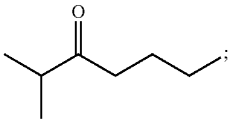

Formula (F3)

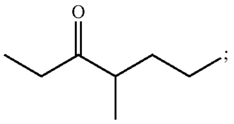

Formula (F4)

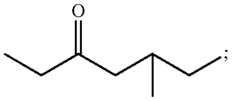

Formula (F5)

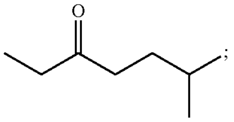

Formula (F6)

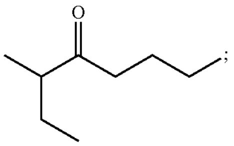

Formula (F7)

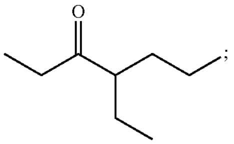

-continued

Formula (F8)

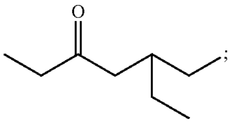

; and

Formula (F9)

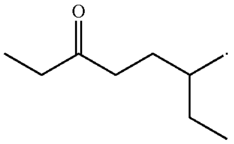

In some embodiments, the additive 53 may be a photo decomposable base (PDB) compound. For example, the additive 53 may have the following general formula (G1):

Formula (G1)

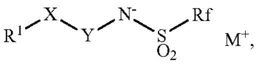

in which $R^1$ is an alicyclic group having 5 or more than 5 carbon atoms substituted with one or more substituents, X is a divalent linking group, Y is a linear, branched, or cyclic alkylene group, or an arylene group, Rf is a hydrocarbon group containing a fluorine atom, and $M^+$ is an organic cation or a metal cation. $M^+$ may be the organic cation represented by the following chemical formulae (H1) to (H2):

Formula (H1)

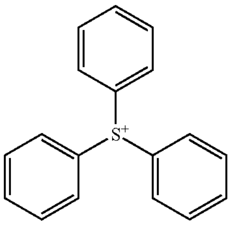

; and

Formula (H2)

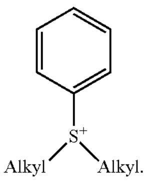

The anion of the general formula (G1) may be represented by the following formulae (I1) to (I6):

Formula (I1)

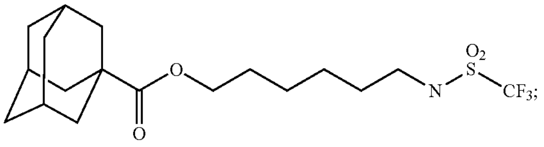

-continued

Formula (I2)

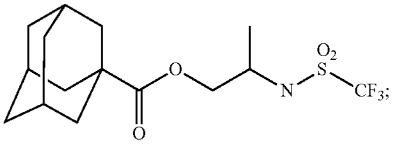

Formula (I3)

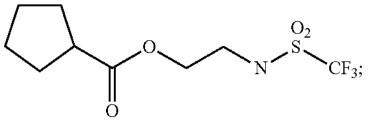

Formula (I4)

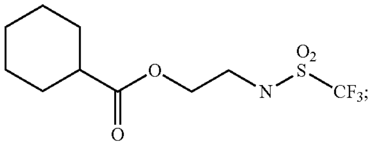

Formula (I5)

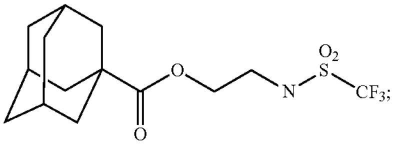

and

Formula (I6)

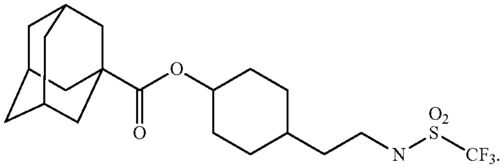

In some embodiments, the additive 53 may be a cyano-based compound including an R group. For example, the additive 53 may have the following general formula (J1): R—CN Formula (J1), where R is an aliphatic or aromatic group, unbranched or branched, cyclic or noncyclic saturated 1 to 24 carbon atoms. In some embodiments, the additive 53 has one of the following chemical formulae (J2) to (J8):

Formula (J2)

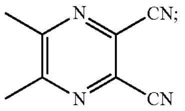

Formula (J3)

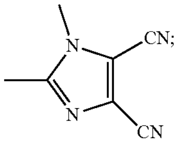

Formula (J4)

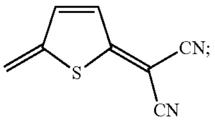

Formula (J5)

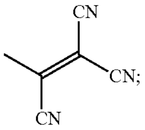

-continued

Formula (J6)

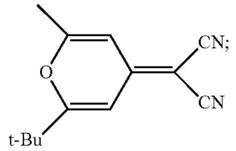

Formula (J7)

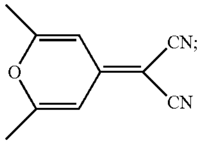

and

Formula (J8)

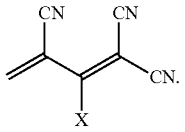

In the formula (J8), X is Phenyl (or Ph), CN or $NH_2$.

In some embodiments, in the step S102, the treatment is performed using one kind or multiple kinds of the additive 53.

Figure 6:
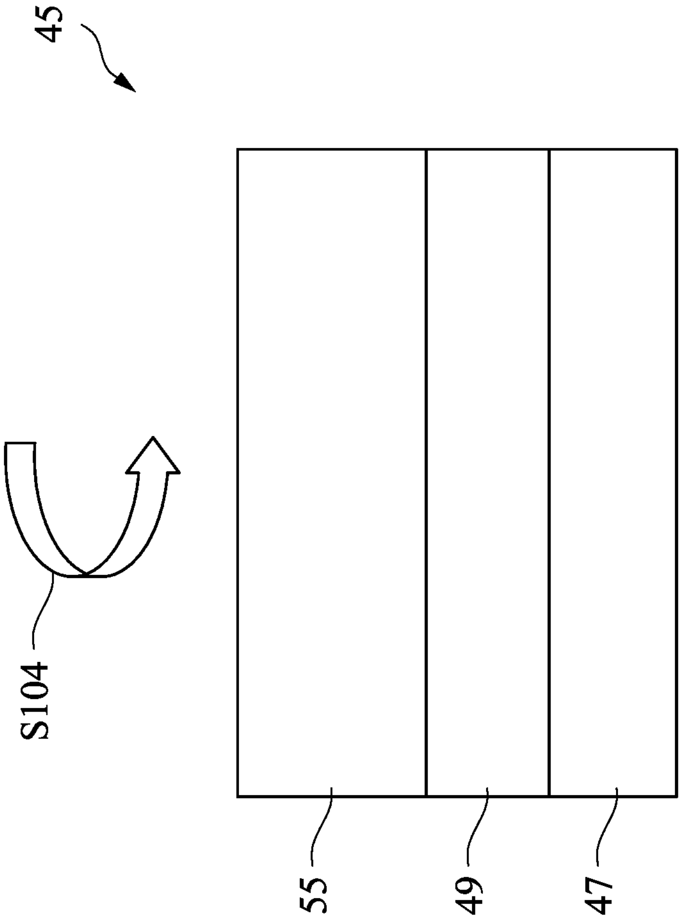
Figure 7:
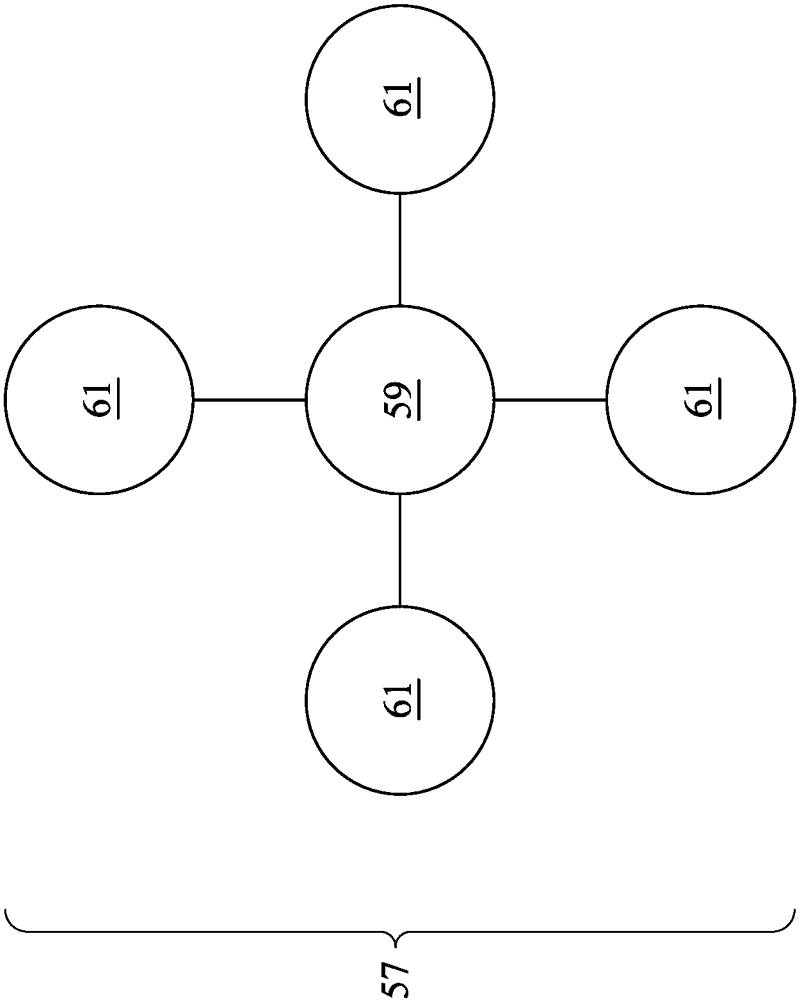
FIG. 7 is a structure of the metallic resist of the resist layer in accordance with some embodiments.

Referring back to FIG. 3A, the method 1000 then proceeds to step S104 where a resist layer is formed on the target layer 49. With reference to FIG. 6, in some embodiments of step S104, the resist layer 55 is formed on the target layer 49. The resist layer 55 may be formed by spin coating process or deposition process. FIG. 7 is a structure of the metallic resist of the resist layer 55 in accordance with some embodiments. In some embodiments, the resist layer 55 may include a metallic resist having a structure 57 as shown in FIG. 7. The structure 57 may be a particle (e.g., a cluster) that includes a core group 59 surround by multiple ligands 61. In the embodiment illustrated in FIG. 7, the lines indicate ionic, covalent, metallic, or van der Waals bonds between the core group 59 and the ligands 61. In some embodiments, the core group 59 includes at least one metallic element in the form of a pure metal (i.e., a metal atom), a metallic ion, a metal compound (e.g., a metal oxide, a metal niride, a metal oxynitride, a metal silicide, a metal carbide, etc), a metal alloy (e.g., a combination of multiple metallic elements), or a combination thereof. In some embodiments, the core group 59 includes a metallic element selected from the following: Ag, Cd, In, Sn, Sb, Te, Cs, Au, Hg, Tl, Pb, Bi, Po, and At. In some embodiments, the core group 59 includes a positively charged metallic ion. The ligands 61 may be the same or different from one another. In some embodiments, the ligands 61 may include a straight or cyclic alkyl, alkoxyl, carboxylic acid, alkene, or other functional groups each having 1 to 12 carbon atoms. In the depicted embodiment, the structure 57 includes the core group 59 and multiple ligands. In some embodiments, the resist layer 55 further includes a solvent in which the structure in FIG. 7 dissolved in.

Figure 8:
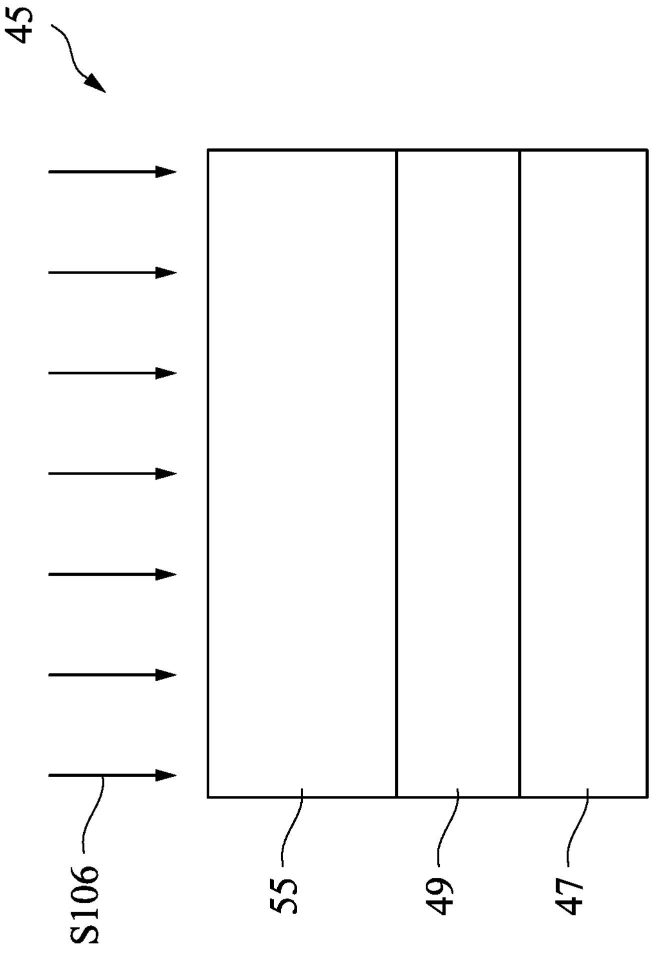
FIGS. 8-13 are diagrammatic fragmentary cross-sectional side views of a semiconductor device at various stages of fabrication in accordance with various aspects of the present disclosure.

Referring back to FIG. 3A, the method 1000 then proceeds to step S106 where a pre-exposure baking is performed to the resist layer. With reference to FIG. 8, in some embodiments of step S106, the resist layer 55 undergoes a pre-exposure baking to evaporate an excess portion of the solvent in the resist layer in some embodiments. The resist layer 55 is baked at a temperature and time sufficient to dry or cure the resist layer 55. In some embodiments, after the pre-exposure baking, the semiconductor device 45 is cooled. The pre-exposure baking and the cooling may be carried out on a heating plate and a cooling plate, respectively.

Figure 9:
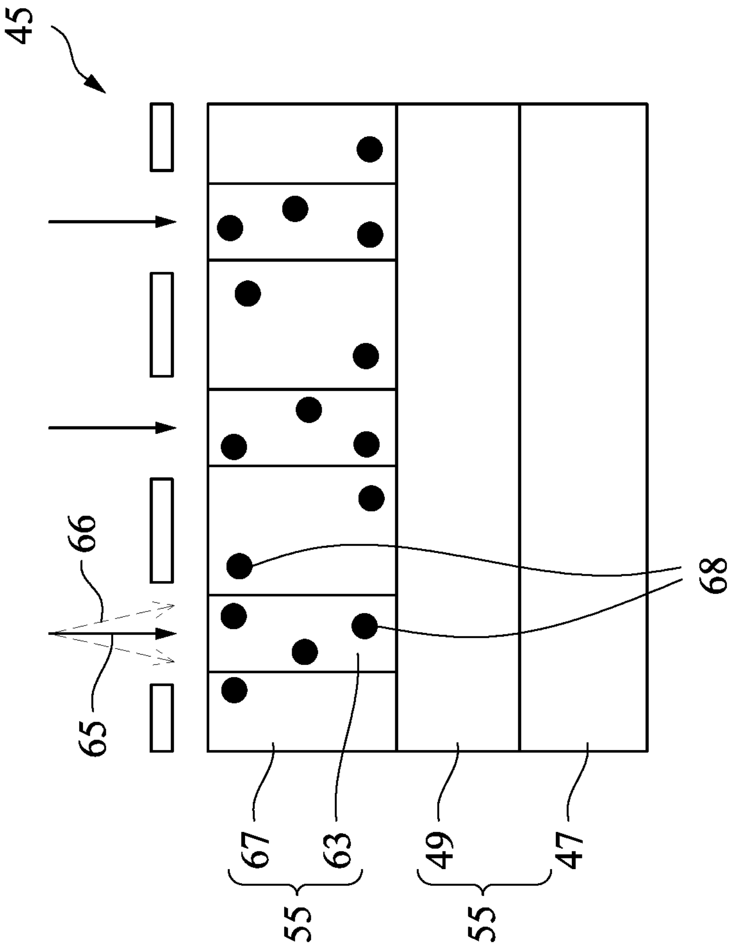

Referring back to FIG. 3A, the method then proceeds to step S108 where the resist layer is exposed. With reference to FIG. 9, in some embodiments of step S108, the resist layer 55 is exposed to an actinic radiation 65. In some embodiments, the resist layer 55 is exposed to an electron-beam or an ultraviolet radiation. In some embodiments, the ultraviolet radiation is a deep ultraviolet radiation (DUV). In some embodiments, the ultraviolet radiation is an extreme ultraviolet (EUV) radiation.

A region 63 of the resist layer 55 exposed to the actinic radiation 65 undergoes a chemical reaction thereby changing its solubility in a subsequently applied developer relative to an unexposed region 67 of the metallic resist layer unexposed to actinic radiation 65. For example, the region 63 has an increased solubility in a developer after being exposed. During exposing, actinic radiation 65 is absorbed in the resist layer 55, producing highly energetic photoelectrons and in turn a cascade of low-energy secondary electrons that diffuse laterally by several nanometers. These electrons increase the extent of chemical reactions in the resist layer 55 which increases its EUV dose sensitivity. Due to light scattered from contamination, multiple reflections, lens inhomogeneity and surface roughness, flare 66 is present during exposing the resist layer 55. The flare 66 allows the unexposed region 67 to produce unwanted secondary electrons 68. Since the target layer 49 is treated with the additive 53, which is beneficial to terminate secondary electrons in the unexposed region 67, and thus can enhance the contrast.

In some other embodiments, the region 63 of the resist layer 55 exposed to the actinic radiation 65 undergoes a crosslinking reaction making the exposed region 63 less soluble in a developer.

Figure 10:
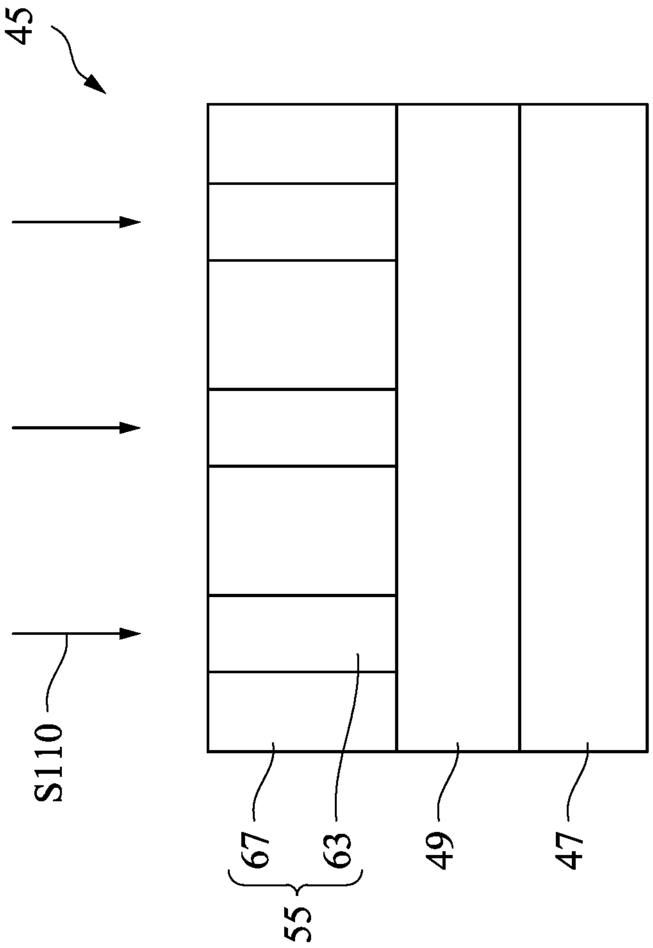

Referring back to FIG. 3B, the method 1000 then proceeds to step S110 where a post-exposure bake is performed to the resist layer. With reference to FIG. 10, in some embodiments of step S110, the resist layer 55 undergoes a post-exposure baking. The post-exposure baking may be used to assist in the generating, dispersing, and reacting of ions or free radicals generated from the impingement of the radiation upon the resist layer 55 during the exposure by the actinic radiation 65. Such assistance helps to create or enhance chemical reactions that generate chemical differences between the exposed region 63 and the unexposed region 67 within the resist layer 55. These chemical differences also cause differences in the solubility between the exposed region 63 and the unexposed region 67. In some embodiments, after the post-exposure baking, the semiconductor device 45 is cooled. The post-exposure baking and the cooling may be carried out on a heating plate and a cooling plate, respectively.

Figure 11:
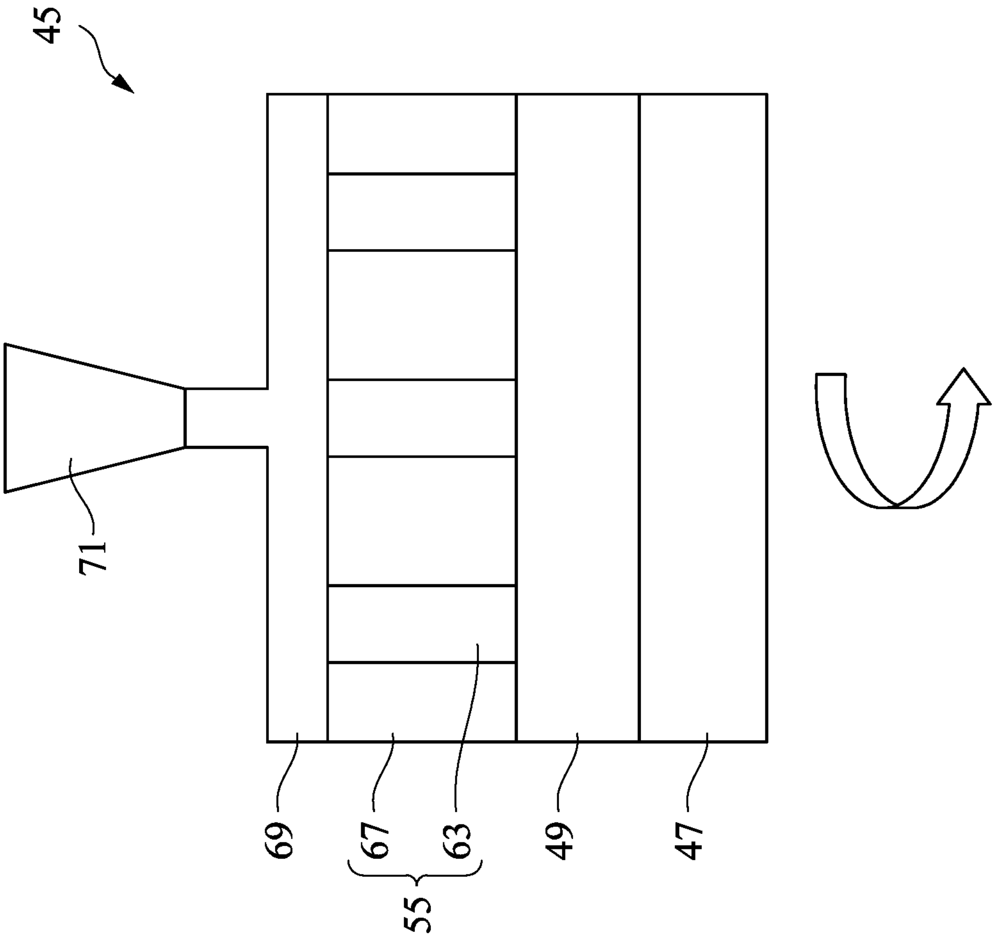
Figure 12:
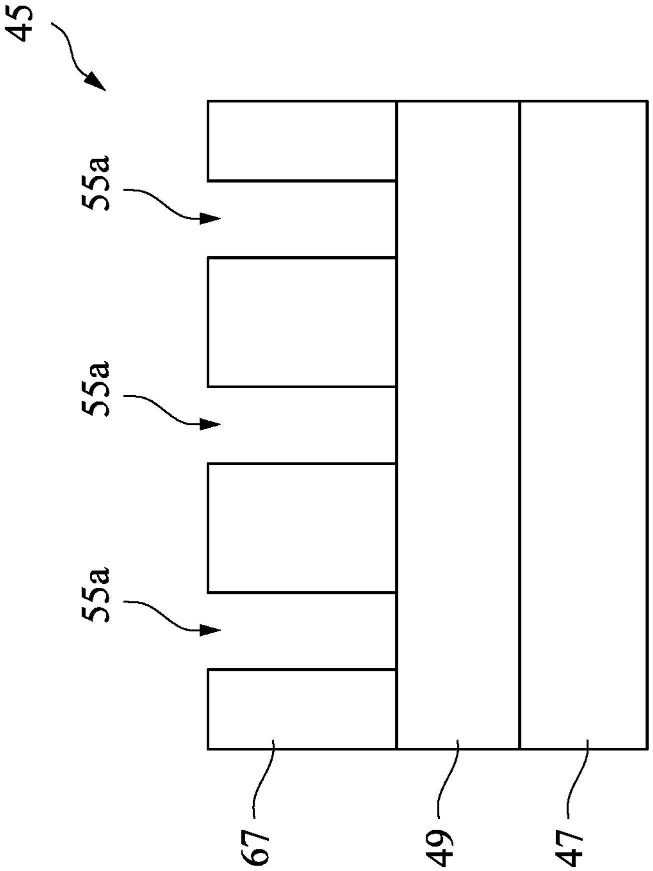

Referring back to FIG. 3B, the method 1000 then proceeds to step S112 where the resist layer is developed. With reference to FIG. 11, in some embodiments of step S112, the resist layer 55 is subsequently developed by applying a developer 69 to the resist layer 55. The developer 69 is supplied from a dispenser 71 to the resist layer 55. In some embodiments, the unexposed region 67 of the resist layer 55 is removed by the developer 69, forming a pattern of openings 55*a* in the resist layer 55 to expose the target layer 49, as shown in FIG. 12. The developer may contain trimethylanilinium hydroxide (TMAH), although other developer fluids are also within the scope of the present disclosure.

In some embodiments, the resist layer 55 is for fabrication process of pitch less than 40 nm. By using the additive 53 as discussed previously with regard to FIG. 5, a line width roughness (LWR) of the resist layer 55 and a pulse energy of the operated laser can be improved. For example, the LWR of the resist layer 55 can be less than 5 nm, and the pulse energy of the operated laser required to expose the resist layer 55 can be less than 70 mJ. In some embodiments, an improvement of the pulse energy of the operated laser can be greater than 3%. Defects of the resist layer 55 can be reduced. For example, the defects in the resist layer 55 could have an improvement of greater than 5%.

Figure 13:
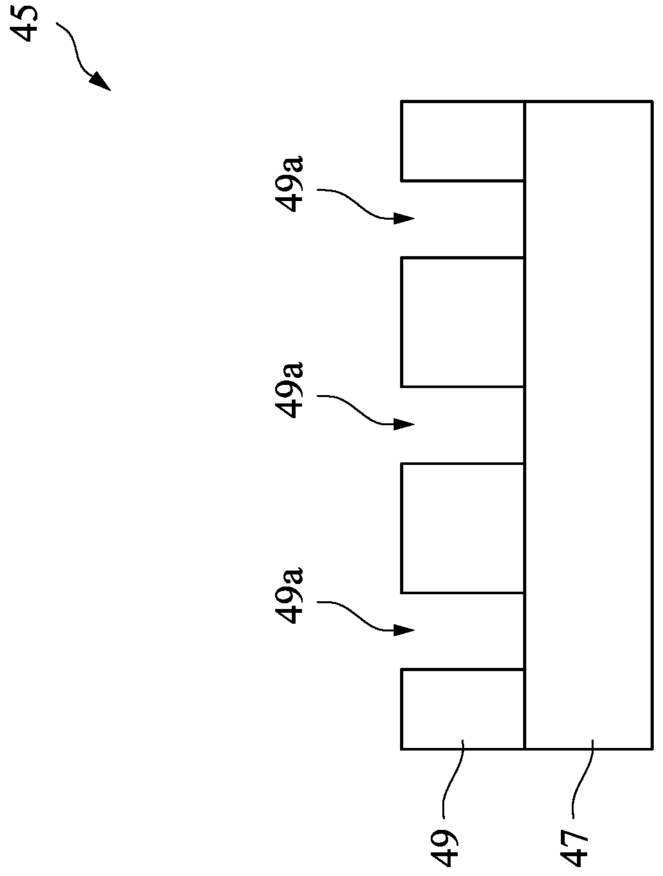

Referring back to FIG. 3B, the method 1000 then proceeds to step S114 where the target layer is etched. With reference to FIG. 12, in some embodiments of step S114, the pattern of openings 55*a* in the resist layer 55 are extended into the target layer 49 to be patterned (or the substrate 47) to create a pattern of openings 49*a* in the target layer 49, thereby transferring the pattern in the resist layer 55 into the target layer 49, as shown in FIG. 13. Due to the reduced line width roughness (LWR) of the resist layer 55, the pattern dimension accuracy of the pattern of the substrate 47 can be improved. The pattern is extended into the target layer 49 by etching, using one or more suitable etchants. The unexposed region 67 is at least partially removed during the etching operation in some embodiments. In other embodiments, the unexposed region 67 is removed after etching the substrate 47 by using a suitable photoresist stripper solvent or by a photoresist ashing operation.

Referring back to FIG. 3A and FIG. 5, although the additive 53 is applied in the step S102, in some other embodiments, the step S102 can be omitted, and the additive 53 can be applied to the semiconductor device 45 in the other steps, in an additional step, or in multiple steps in FIGS. 3A and 3B.

Figure 3C:
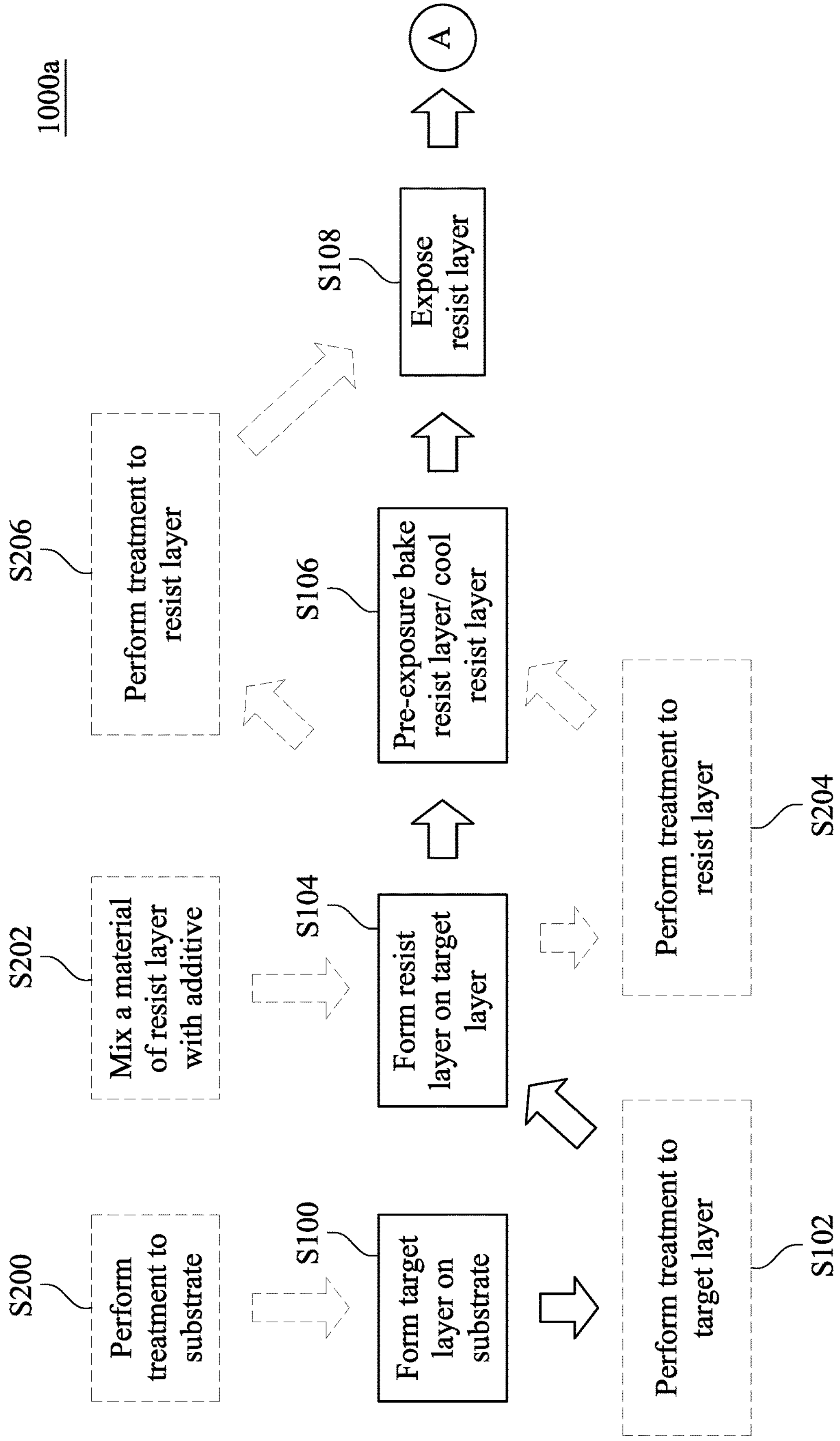
FIGS. 3C and 3D illustrates a flowchart of an exemplary method for patterning a target layer in accordance with some embodiments.
Figure 3D:
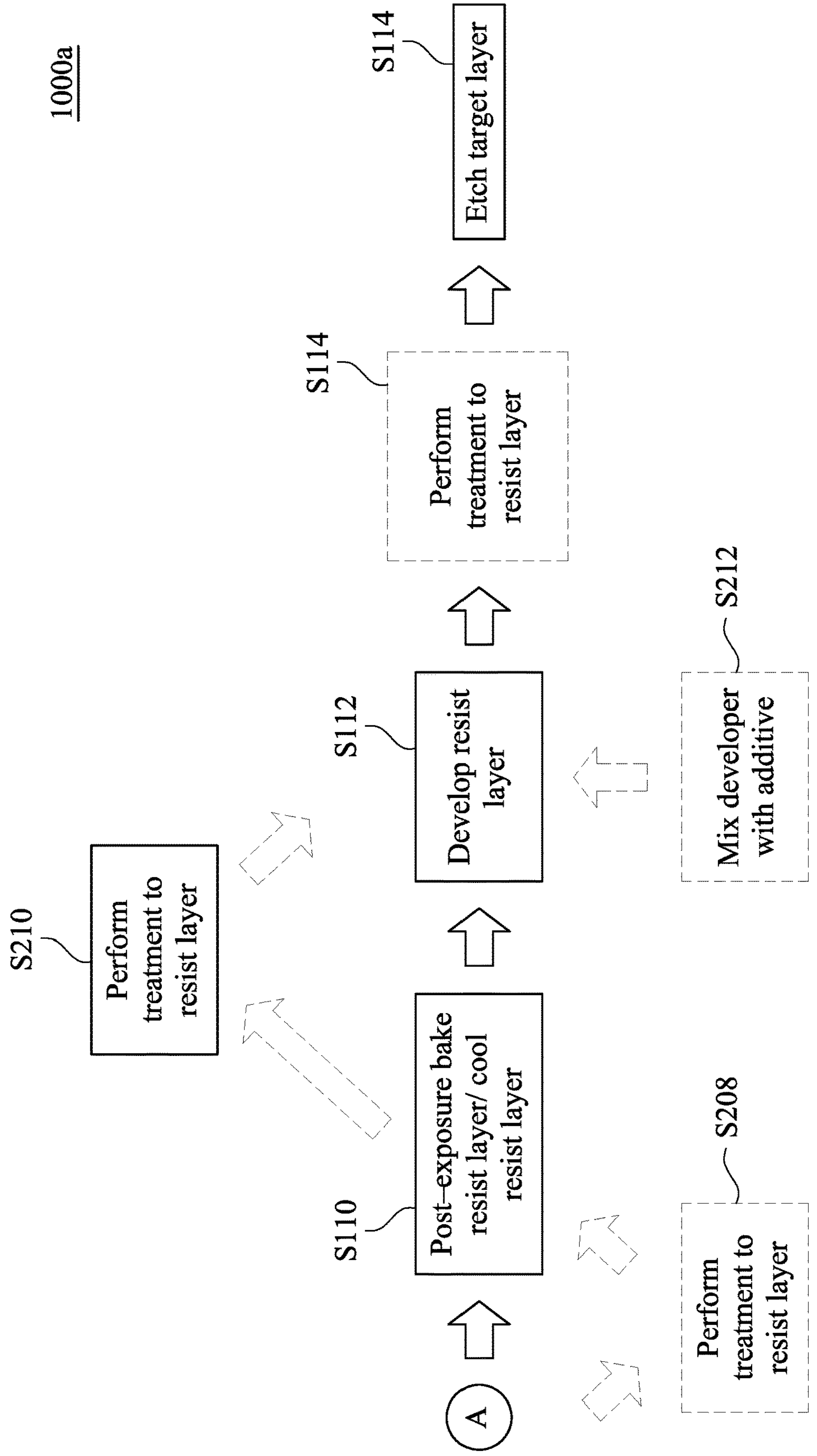

FIGS. 3C and 3D illustrates a flowchart of an exemplary method 1000*a* for patterning a target layer in accordance with some embodiments. The method 1000*a* is similar to the method 1000, except for including multiple steps. Referring to step S200 of FIG. 3C, in some embodiments, prior to forming the target layer on the substrate (step S100), a treatment is performed to the substrate. The treatment in the step S200 is similar to the treatment in the step S102, and thus the description thereof is omitted.

Referring to step S202 of FIG. 3C, in some embodiments, prior to forming the resist layer on the target layer (step S104), a material of the resist layer is mixed with an additive having a chemical formula as discussed with regard to FIG. 5 to form a mixture. Thereafter, in the step S104, forming the resist layer including the mixture including the additive on the target layer. In some embodiments, the additive have a composition different from a composition of the metallic resist of the resist layer.

Referring to step S204 of FIG. 3C, in some embodiments, after forming the resist layer on the target layer (step S104), a treatment is performed to the resist layer. The treatment in the step S204 is similar to the treatment in the step S102, and thus the description thereof is omitted. After the step S204, the pre-exposure baking is performed to the resist layer (step S106).

Referring to step S206 of FIG. 3C, in some embodiments, after performing the pre-exposure baking to the resist layer (step S106), a treatment is performed to the resist layer. The treatment in the step S206 is similar to the treatment in the step S102, and thus the description thereof is omitted. In some embodiments, the treatment in the step S206 may be carried out on the heating plate or the cooling plate. After the step S206, the resist layer is exposed (step S108).

Referring to step S208 of FIG. 3D, in some embodiments, after the resist layer is exposed (step S108 in FIG. 3C), a treatment is performed to the resist layer. The treatment in the step S208 is similar to the treatment in the step S102 in FIG. 3C, and thus the description thereof is omitted. After the step S208, the post-exposure baking is performed to the resist layer (step S110).

Referring to step S210 of FIG. 3D, in some embodiments, after the resist layer is post-exposure baked (step S110), a treatment is performed to the resist layer. The treatment in the step S210 is similar to the treatment in the step S102 in FIG. 3C, and thus the description thereof is omitted. After the step S210, the resist layer is developed (step S112). In some embodiments, the treatment in the step S210 may be carried out on the heating plate or the cooling plate.

Referring to step S212 of FIG. 3D, in some embodiments, prior to developing the resist layer (step S112), a material of the developer is mixed with an additive having a chemical formula as discussed with regard to FIG. 5 to form a mixture. Thereafter, in the step S112, the resist layer is developed with the developer including the mixture including the additive. The additive and the developer include different compositions.

Referring to step S214 of FIG. 3D, in some embodiments, after developing the resist layer (step S112), a treatment is performed to the resist layer. The treatment in the step S112 is similar to the treatment in the step S102, and thus the description thereof is omitted. After the step S214, the target layer is etched (step S114).

Figure 14:
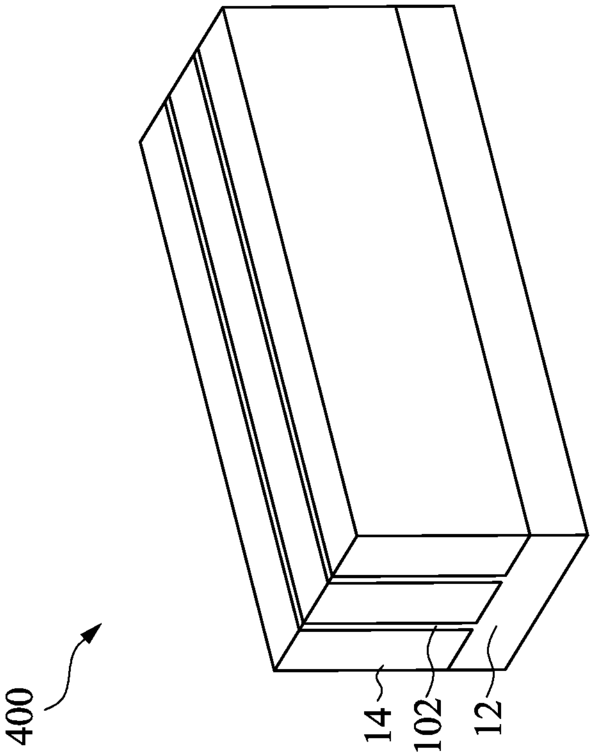
FIGS. 14, 15, and 16A illustrate perspective views of additional fabrication processes in the formation of a semiconductor device using a substrate in accordance with some embodiments of the present disclosure.
Figure 15:
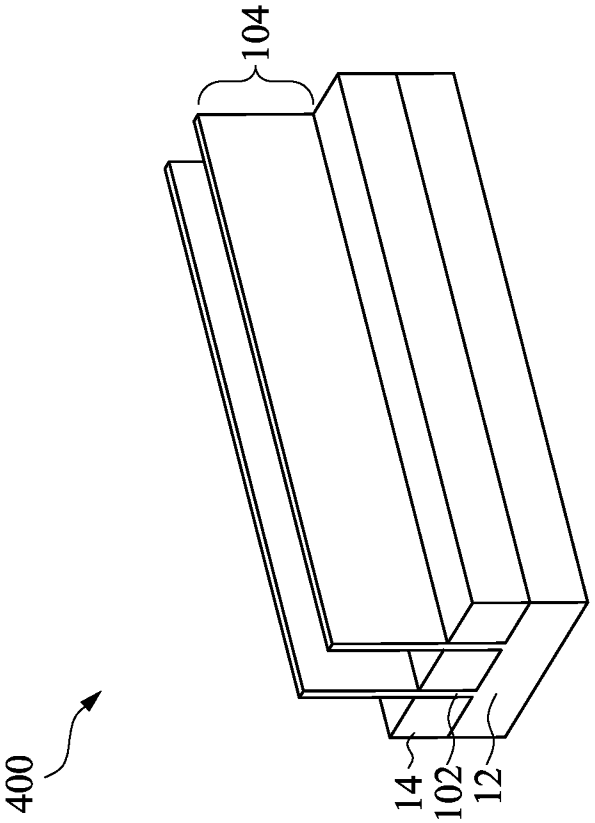
Figure 16A:
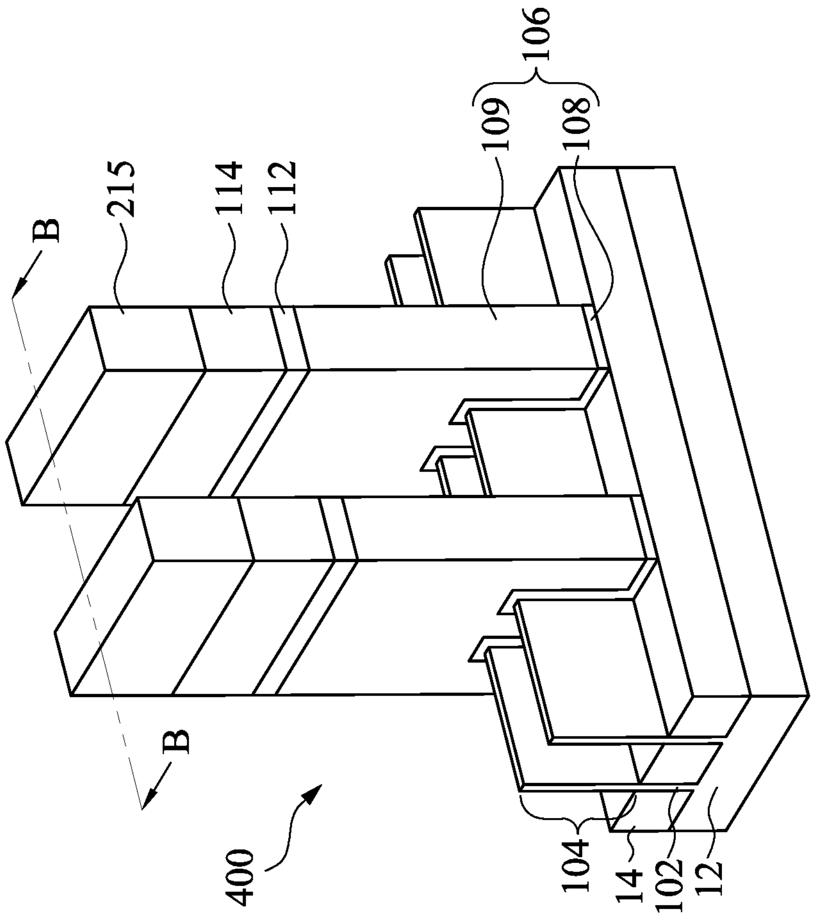

FIGS. 14, 15, and 16A illustrate perspective views of additional fabrication processes in the formation of a semiconductor device 400 on a substrate 12 in accordance with some embodiments of the present disclosure. FIGS. 16B, 17, 18 and 19 illustrate cross-sectional views of additional fabrication processes in the formation of a semiconductor device 400 using a substrate 12 in accordance with some embodiments of the present disclosure. Reference is made to FIG. 14. FIG. 14 illustrates a perspective view of an initial structure. The initial structure includes the substrate 12. The substrate 12 is similar to the substrate 47 in terms of composition. Isolation regions such as shallow trench isolation (STI) regions 14 may be formed to extend into the substrate 12. The portions of substrate 12 between neighboring STI regions 14 are referred to as semiconductor strips 102. The semiconductor strips 102 can be formed by patterning the substrate 12 by a resist layer using the method 1000 or the method 1000*a* as discussed previously with regard to FIGS. 3A-3D. Since the contrast of the resist layer (not shown) used to pattern the substrate 12 has an enhanced contrast, a pattern dimension accuracy of the semiconductor strips 102 of the substrate 12 can be improved.

The STI regions 14 may include a liner oxide (not shown). The liner oxide may be formed of a thermal oxide formed through a thermal oxidation of a surface layer of the substrate 12. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). The STI regions 14 may also include a dielectric material over the liner oxide, and the dielectric material may be formed using flowable chemical vapor deposition (FCVD), spin-on coating, or the like.

Referring to FIG. 15, the STI regions 14 are recessed, so that the top portions of semiconductor strips 102 protrude higher than the top surfaces of the neighboring STI regions 14 to form protruding fins 104. The etching may be performed using a dry etching process or a wet etching process.

The materials of fins 104 may also be replaced with materials different from that of substrate 12. For example, if the fins 104 serve for n-type transistors, protruding fins 104 may be formed of Si, SiP, SiC, SiPC, or a III-V compound semiconductor such as InP, GaAs, AlAs, InAs, InAlAs, InGaAs, or the like. On the other hand, if the fins 104 serve for p-type transistors, the protruding fins 104 may be formed of Si, SiGe, SiGeB, Ge, or a III-V compound semiconductor such as InSb, GaSb, InGaSb, or the like.

Figure 16B:
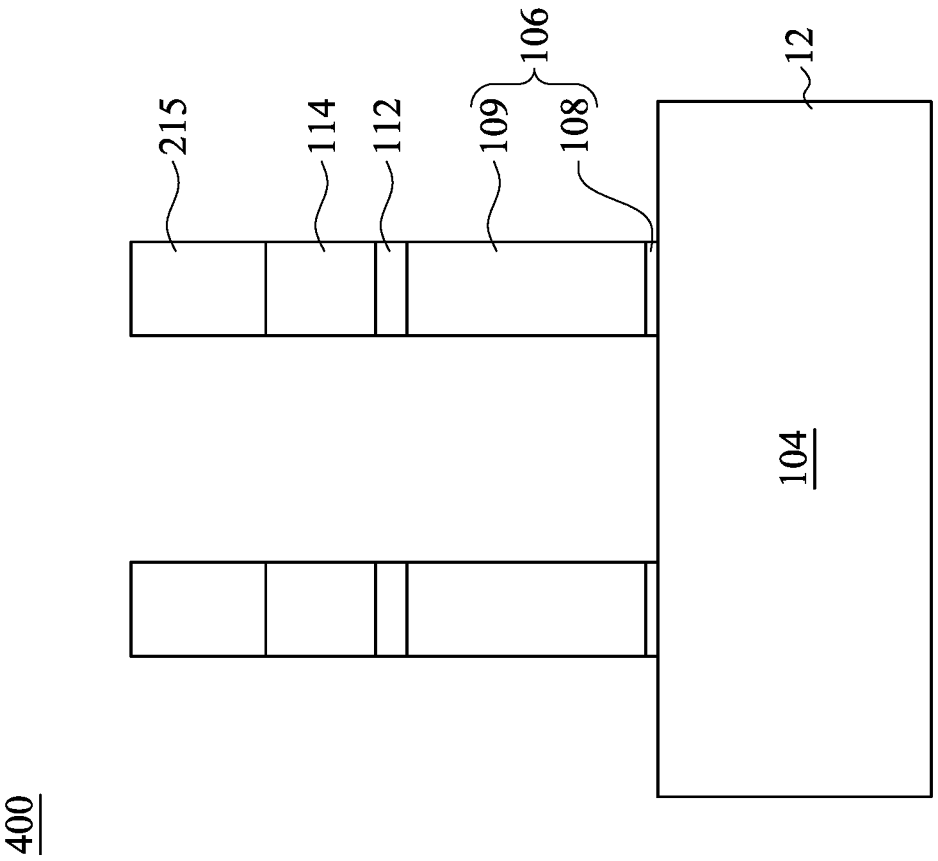
FIGS. 16B, 17, 18 and 19 illustrate cross-sectional views of additional fabrication processes in the formation of a semiconductor device using a substrate in accordance with some embodiments of the present disclosure.

Referring to FIGS. 16A and 16B, dummy gate structures 106 are formed on the top surfaces and the sidewalls of fins 104. FIG. 16B illustrates a cross-sectional view obtained from a vertical plane containing line B-B in FIG. 16A. Formation of the dummy gate structures 106 includes depositing in sequence a blankly formed gate dielectric layer and a blankly formed dummy gate electrode layer across the fins 104, followed by patterning the blanket formed gate dielectric layer and the blankly formed dummy gate electrode layer. As a result of the patterning, the dummy gate structure 106 includes a dummy gate dielectric layer 108 and a dummy gate electrode 109 over the dummy gate dielectric layer 108. The dummy gate dielectric layers 108 can be any acceptable dielectric layer, such as silicon oxide, silicon nitride, the like, or a combination thereof, and may be formed using any acceptable process, such as thermal oxidation, a spin process, CVD, or the like. The dummy gate electrodes 109 can be any acceptable electrode layer, such as comprising polysilicon, metal, the like, or a combination thereof. The gate electrode layer can be deposited by any acceptable deposition process, such as CVD, plasma enhanced CVD (PECVD), or the like. Each of dummy gate structures 106 crosses over a single one or a plurality of fins 104. The dummy gate structures 106 may have lengthwise directions perpendicular to the lengthwise directions of the respective fins 104.

In some embodiments, the blankly formed dummy gate electrode layer and the blankly formed gate dielectric layer may be patterned using a tri-layer structure. Bottom masks 112, top masks 114 and resist layers 215, in which the resist layers 215 is similar to the resist layer 55 with regard to FIGS. 6-12 in terms of composition and formation method, are formed over the blankly formed dummy gate electrode layer in sequence. The above discussion of resist layer 55 applies to the resist layers 215, unless mentioned otherwise. By using the resist layers 215 as a mask, the pattern dimension accuracy of the underlying layer (e.g., the dummy gate electrodes 109 and the dummy gate dielectric layers 108) can be improved.

In an alternative embodiment, the bottom masks 112 and the top masks 114 are made of one or more layers of $SiO_2$, SiCN, SiON, $Al_2O_3$, SiN, or other suitable materials. In certain embodiments, the bottom masks 112 include silicon nitride, and the top masks 114 include silicon oxide. In some embodiments, the blankly formed dummy gate electrode layer and the blankly formed gate dielectric layer may be patterned using only the resist layers 215 without using the bottom masks 112 and the top masks 114.

Figure 17:
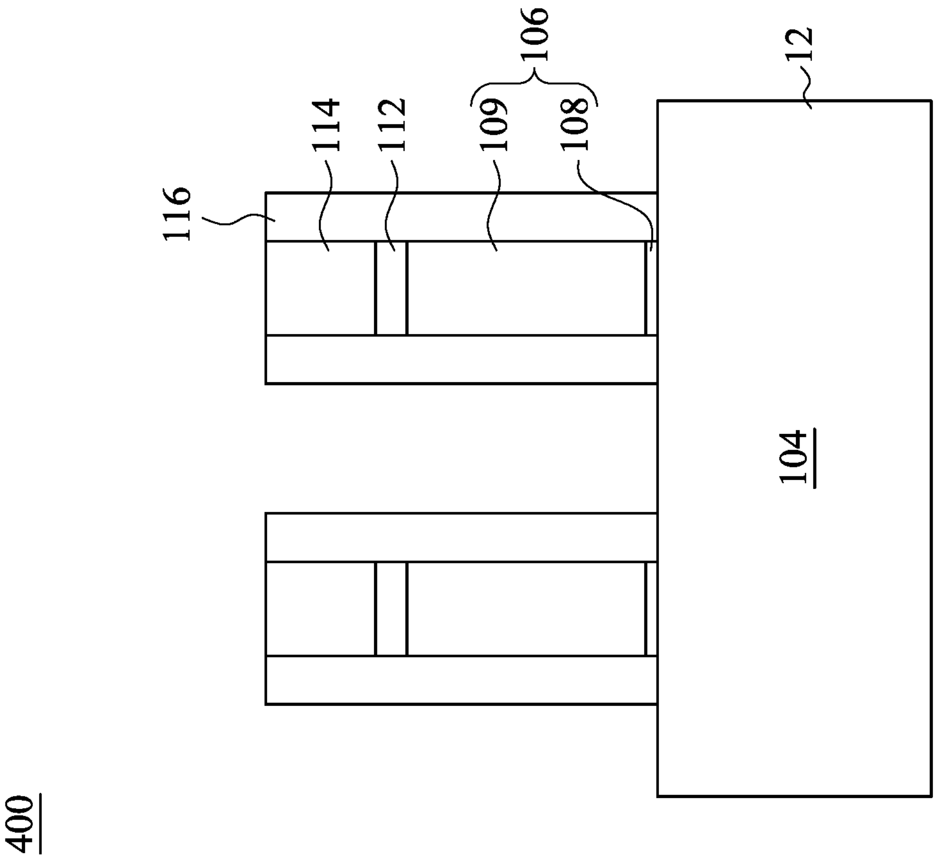

Next, as illustrated in FIG. 17, gate spacers 116 are formed on sidewalls of the dummy gate structures 106. In some embodiments of the gate spacer formation step, a spacer material layer is deposited on the substrate 12. The spacer material layer may be a conformal layer that is subsequently etched back to form gate spacers 116. The spacer material layer is made of a low-k dielectric material. The low-k dielectric material has a dielectric constant (k value) of lower than about 3.5. Suitable materials for the low-k dielectric material may include silicon oxide, silicon nitride, silicon oxynitride, or the like. By way of example and not limitation, the spacer material layer may be formed using processes such as, CVD process, a subatmospheric CVD (SACVD) process, a flowable CVD process, an ALD process, a physical vapor deposition (PVD) process, or other suitable process. An anisotropic etching process is then performed on the deposited spacer material layer to expose portions of the fins 104 not covered by the dummy gate structures 106 (e.g., in source/drain regions of the fins 104). Portions of the spacer material layer directly above the dummy gate structures 106 may be completely removed by this anisotropic etching process. Portions of the spacer material layer on sidewalls of the dummy gate structures 106 may remain, forming gate spacers, which are denoted as the gate spacers 116, for the sake of simplicity. In some embodiments, the gate spacers 116 may be used to offset subsequently formed doped regions, such as source/drain regions. The gate spacers 116 may further be used for designing or modifying the source/drain region profile.

Figure 18:
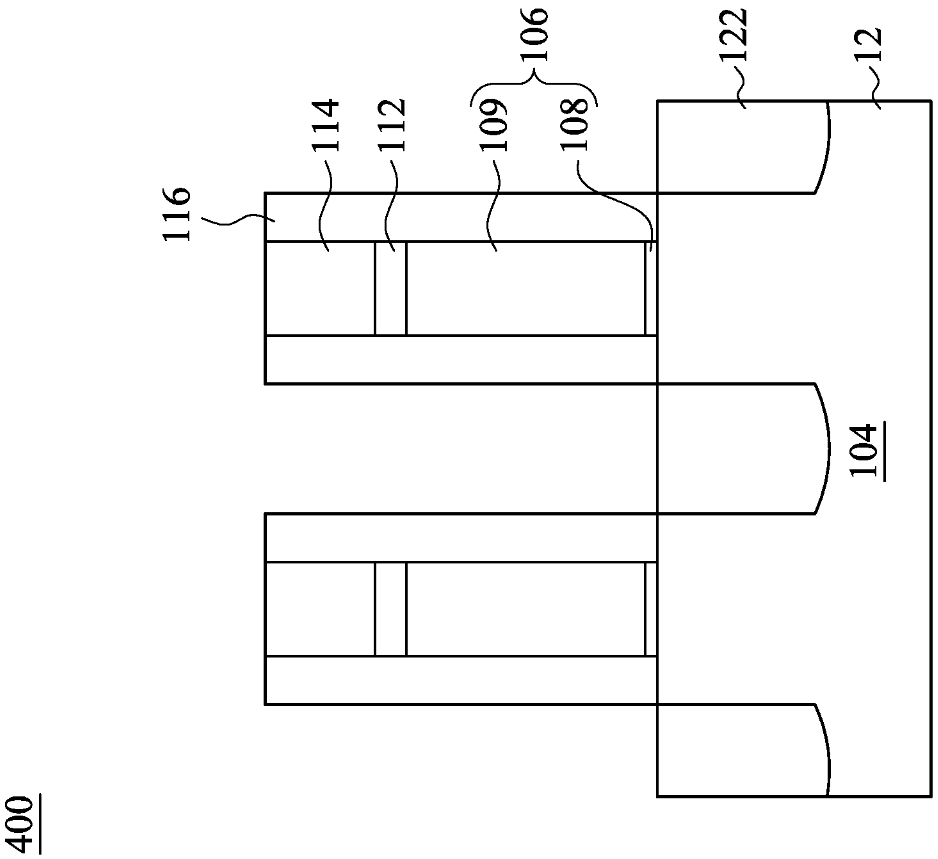

In FIG. 18, after formation of the gate spacers 116 is completed, source/drain epitaxial structures 122 are formed on source/drain regions of the protruding fins 104 that are not covered by the dummy gate structures 106 and the gate spacers 116. In some embodiments, formation of the source/drain epitaxial structures 122 includes recessing source/drain regions of the fin 104, followed by epitaxially growing semiconductor materials in the recessed source/drain regions of the fin 104. The source/drain epitaxial structures 122 are on opposite sides of the dummy gate structure 106.

The source/drain regions of the fins 104 can be recessed using suitable selective etching processing that attacks the fins 104, but hardly attacks the gate spacers 116 and the top masks 114 of the dummy gate structures 106. For example, recessing the fins 104 may be performed by a dry chemical etch with a plasma source and an etchant gas. The plasma source may be inductively coupled plasma (ICR) etch, transformer coupled plasma (TCP) etch, electron cyclotron resonance (ECR) etch, reactive ion etch (RIE), or the like and the etchant gas may be fluorine, chlorine, bromine, combinations thereof, or the like, which etches the protruding fins 104 at a faster etch rate than it etches the gate spacers 116 and the top masks 114 of the dummy gate structures 106. In some other embodiments, recessing the protruding fins 104 may be performed by a wet chemical etch which etches the fins 104 at a faster etch rate than it etches the gate spacers 116 and the top masks 114 of the dummy gate structures 106. In some other embodiments, recessing the protruding fins 104 may be performed by a combination of a dry chemical etch and a wet chemical etch.

Once recesses are created in the source/drain regions of the fin 104, source/drain epitaxial structures 122 are formed in the source/drain recesses in the fin 104 by using one or more epitaxy or epitaxial (epi) processes that provides one or more epitaxial materials on the protruding fins 104. During the epitaxial growth process, the gate spacers 116 limit the one or more epitaxial materials to source/drain regions in the fin 104. In some embodiments, the lattice constants of the source/drain epitaxial structures 122 are different from the lattice constant of the fins 104, so that the channel region in the fin 104 and between the source/drain epitaxial structures 122 can be strained or stressed by the source/drain epitaxial structures 122 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes.

The epitaxy process may use gaseous and/or liquid precursors, which interact with the composition of the fins 104.

In some embodiments, the source/drain epitaxial structures 122 may include Ge, Si, GaAs, AlGaAs, SiGe, GaAsP, SiP, or other suitable material. The source/drain epitaxial structures 122 may be in-situ doped during the epitaxial process by introducing doping species including p-type dopants, such as boron or $BF_2$, n-type dopants, such as phosphorus or arsenic, and/or other suitable dopants including combinations thereof. If the source/drain epitaxial structures 122 are not in-situ doped, an implantation process (i.e., a junction implant process) is performed to dope the source/drain epitaxial structures 122. In some exemplary embodiments, the source/drain epitaxial structures 122 in an n-type transistor include SiP, while those in a p-type include GeSnB and/or SiGeSnB. In embodiments with different device types, a mask, such as a photoresist, may be formed over n-type device regions, while exposing p-type device regions, and p-type epitaxial structures may be formed on the exposed fins 104 in the p-type device regions. The mask may then be removed. Subsequently, a mask, such as a photoresist, may be formed over the p-type device region while exposing the n-type device regions, and n-type epitaxial structures may be formed on the exposed fins 104 in the n-type device region. The mask may then be removed.

Once the source/drain epitaxial structures 122 are formed, an annealing process can be performed to activate the p-type dopants or n-type dopants in the source/drain epitaxial structures 122. The annealing process may be, for example, a rapid thermal anneal (RTA), a laser anneal, a millisecond thermal annealing (MSA) process or the like.

Figure 19:
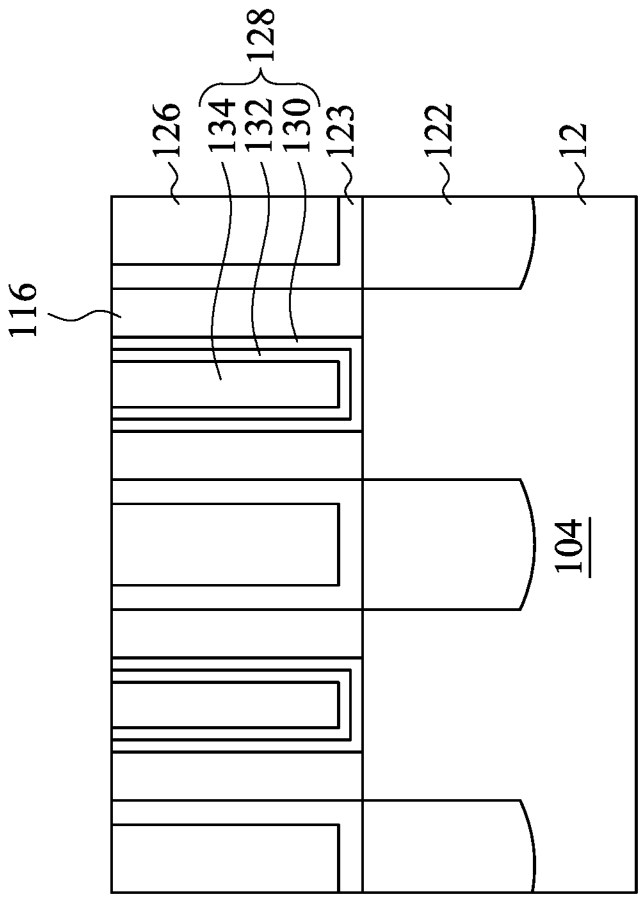

Next, in FIG. 19, a contact etch stop layer (CESL) 123 and an interlayer dielectric (ILD) layer 126 are formed on the substrate 12 in sequence. In some examples, the CESL 123 includes a silicon nitride layer, silicon oxide layer, a silicon oxynitride layer, and/or other suitable materials having a different etch selectivity than the ILD layer 126. The CESL 123 may be formed by plasma-enhanced chemical vapor deposition (PECVD) process and/or other suitable deposition or oxidation processes. In some embodiments, the ILD layer 126 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 123. The ILD layer 126 may be deposited by a PECVD process or other suitable deposition technique. In some embodiments, after formation of the ILD layer 126, the wafer may be subject to a high thermal budget process to anneal the ILD layer 126.

In some examples, after forming the ILD layer 126, a planarization process may be performed to remove excessive materials of the ILD layer 126 and the CESL 123. For example, a planarization process includes a chemical mechanical planarization (CMP) process which removes portions of the ILD layer 126 and the CESL 123 overlying the dummy gate structures 106. In some embodiments, the CMP process also removes bottom masks 112 and top masks 114 (as shown in FIG. 16B) and exposes the dummy gate electrodes 109.

An etching process is performed to remove the dummy gate electrode 109 and the dummy gate dielectric layer 108, resulting in gate trenches between corresponding gate spacers 116. The dummy gate structures 106 are removed using a selective etching process (e.g., selective dry etching, selective wet etching, or a combination thereof) that etches materials in the dummy gate structures 106 at a faster etch rate than it etches other materials (e.g., gate spacers 116 and/or the ILD layer 126).

Thereafter, replacement gate structures 128 are respectively formed in the gate trenches. The gate structures 128 may be the final gates of FinFETs. In FinFETs, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. The final gate structures each may be a high-k/metal gate (HKMG) stack, however other compositions are possible. In some embodiments, each of the gate structures 128 forms the gate associated with the three-sides of the channel region provided by the fin 104. Stated another way, each of the gate structures 128 wraps around the fin 104 on three sides.

In various embodiments, the high-k/metal gate structure 128 includes a gate dielectric layer 130 lining the gate trench, a work function metal layer 132 formed over the gate dielectric layer 130, and a fill metal 134 formed over the work function metal layer 132 and filling a remainder of gate trenches. The gate dielectric layer 130 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 132 and/or the fill metal 134 used within high-k/metal gate structures 128 may include a metal, metal alloy, or metal silicide. Formation of the high-k/metal gate structures 128 may include multiple deposition processes to form various gate materials, one or more liner layers, and one or more CMP processes to remove excessive gate materials.

In some embodiments, the interfacial layer of the gate dielectric layer 130 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 130 may include hafnium oxide ($HfO_2$). Alternatively, the gate dielectric layer 130 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 132 may include work function metals to provide a suitable work function for the high-k/metal gate structures 128. For an n-type FinFET, the work function metal layer 132 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FinFET, the work function metal layer 132 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

The work function metal layer 132 may include work function metals to provide a suitable work function for the high-k/metal gate structures 128. For an n-type FinFET, the work function metal layer 132 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FinFET, the work function metal layer 132 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 134 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

In some embodiments, the semiconductor device 400 includes other layers or features not specifically illustrated. In some embodiments, back end of line (BEOL) processes are performed on the semiconductor device 400. In some embodiments, the semiconductor device 400 is formed by a non-replacement metal gate process or a gate-first process.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiments. One advantage is that the additive for lithography is beneficial to terminate the secondary electrons in the unexposed region, and thus enhance the contrast. Another advantage is that the LWR of the resist layer can be less than 5 nm, and the pulse energy of the operated laser required to expose the resist layer can be less than 70 mJ. Yet another advantage is that an improvement of the pulse energy of the operated laser can be greater than 3%. Yet another advantage is that the defects in the resist layer could have an improvement of greater than 5%.

In some embodiments, a method includes the following steps. A target layer is formed on a substrate. A resist layer is formed on the target layer. The resist layer is exposed such that secondary electrons are produced in the resist layer. The secondary electrons are terminated using an additive. The resist layer is developed. The target layer is etched using the developed resist layer as a mask. In some embodiments, the additive includes one of chemical formulae (A1) to (A6):

Formula (A1)

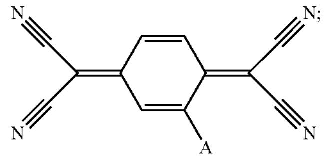

Formula (A2)

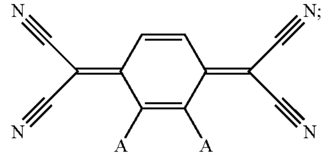

Formula (A3)

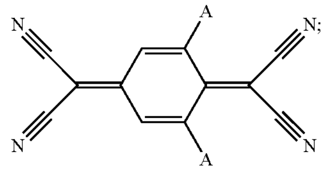

Formula (A4)

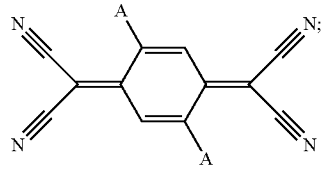

Formula (A5)

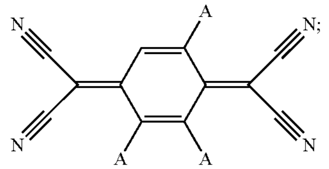

and

Formula (A6)

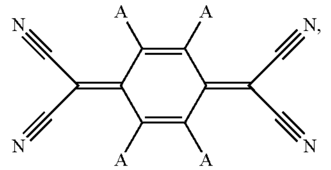

and wherein A in the Formulae (A1) to (A6) is H, F, Cl, R, or OR, and in the R and OR, R is composed by unbranched or branched, cyclic or noncyclic saturated 1 to 12 carbon atoms. In some embodiments, the additive includes one of chemical formulae (B1) to (B4):

Formula (B1)

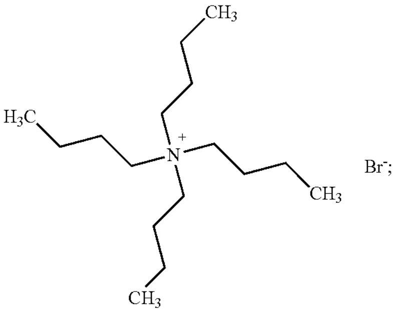

Tetra-n-butylammonium bromide (TBABr)

Formula (B2)

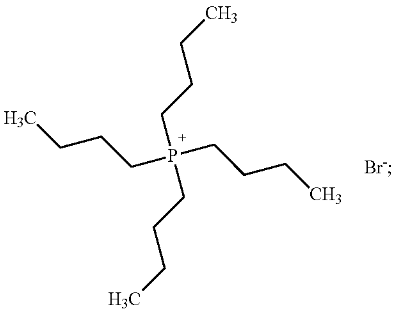

Tetrabutylphosphonium bromide (TBPBr)

Formula (B3)

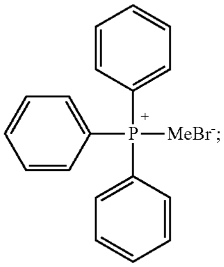

and

Methyltriphenylphosphonium bromide (mTPPBr)

Formula (B4)

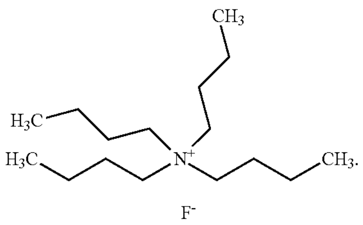

tetra-n-butylammonium fluoride (TABF)

In some embodiments, the additive includes a photo acid generator including a cation having one of chemical formulae (C1) and (C2):

Formula (C1)

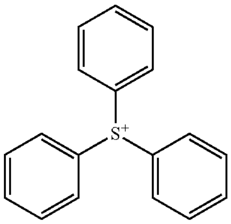

; and

Formula (C2)

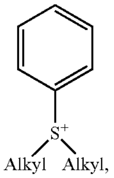

and an anion having one of chemical formulae (D1) to (D7):

$C_4F_9SO_3^-$ Formula (D1);

$C_6F_{13}SO_3^-$ Formula (D2);

Formula (D3)

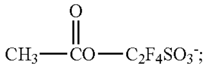

Formula (D4)

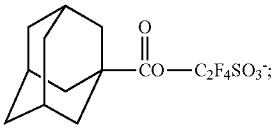

Formula (D5)

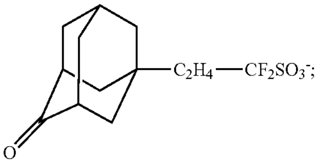

Formula (D6)

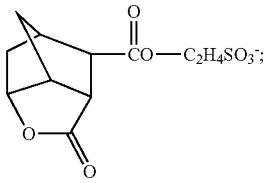

and

Formula (D7)

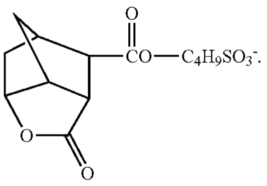

In some embodiments, the additive includes a formula (E1):

Formula (E1)

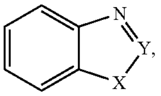

and wherein X in the Formula (E1) is N, NH or S, Y in the formula (E1) is S, O, Se, NH, NR, or R, in which R is cyclic or noncyclic, saturated or non-saturated 1 to 24 carbon units with hydrogen or halogen. In some embodiments, the additive includes one of chemical formulae (E2) to (E9):

Formula (E2)

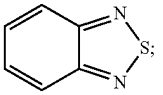

(benzothiadiazole)

Formula (E3)

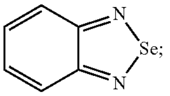

(benzoselenadiazole)

Formula (E4)

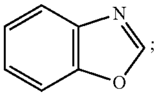

(benzoxazole)

Formula (E5)

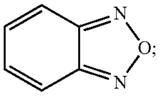

(benzofurazan)

Formula (E6)

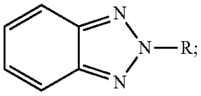

Formula (E7)

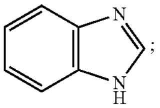

(benzimidazole)

Formula (E8)

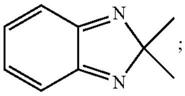

; and

Formula (E9)

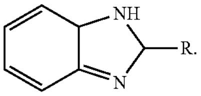

In some embodiments, the additive includes a chemical formula (E10):

Formula (E10)

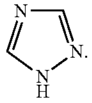

(triazole)

In some embodiments, the additive includes one of chemical formulae (E11) and (E12):

Formula (E11)

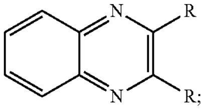

and

Formula (E12)

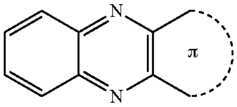

, and wherein R in the formula (E11) is 1 to 24 carbon units with hydrogen or halogen. In some embodiments, the additive includes one of chemical formulae (E13) and (E14):

Formula (E13)

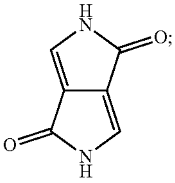

and (diketopyrrolopyrrole)

Formula (E14)

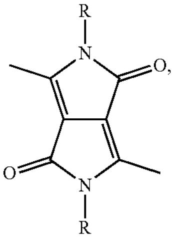

and wherein R in the formula (E14) is 1 to 24 carbon units with hydrogen or halogen. In some embodiments, the additive includes a formula (F1):

Formula (F1)

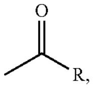

and wherein R in the Formula (F1) is an aliphatic or aromatic group, unbranched or branched, cyclic or noncyclic saturated 3 to 24 carbon atoms. In some embodiments, the additive includes one of chemical formulae (F2) to (F9):

Formula (F2)

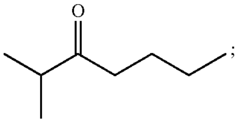

Formula (F3)

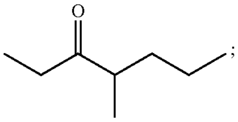

-continued

Formula (F4)

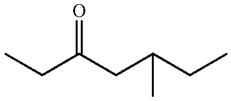

;

Formula (F5)

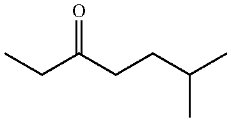

;

Formula (F6)

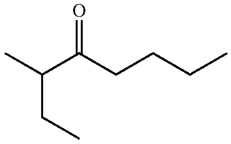

;

Formula (F7)

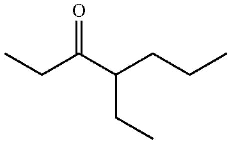

;

Formula (F8)

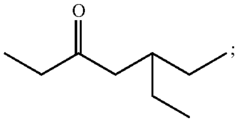

; and

Formula (F9)

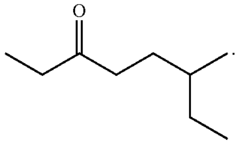

.

In some embodiments, the additive includes a formula (G1):

Formula (G1)

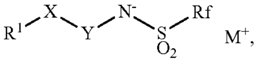

, in which $R^1$ is an alicyclic group having 5 or more than 5 carbon atoms substituted with one or more substituents, X is a divalent linking group, Y is a linear, branched, or cyclic alkylene group, or an arylene group, Rf is a hydrocarbon group containing a fluorine atom, and $M^+$ is an organic cation or a metal cation. In some embodiments, the $M^+$ is represented by chemical formulae (H1) or (H2):

Formula (H1)

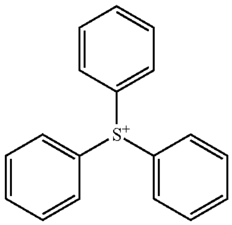

; and

-continued

Formula (H2)

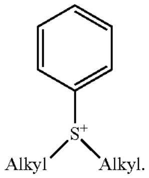

.

In some embodiments, an anion of the formula (G1) is represented by formulae (I1) to (I6):

Formula (I1)

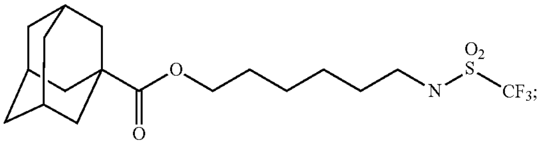

;

Formula (I2)

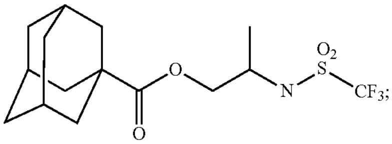

;

Formula (I3)

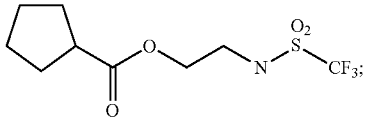

;

Formula (I4)

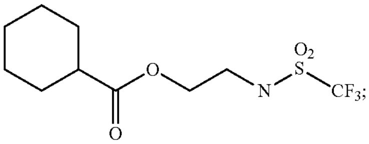

;

Formula (I5)

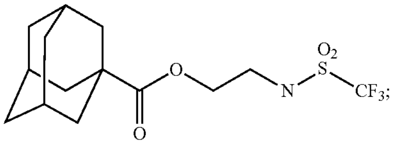

; and

Formula (I6)

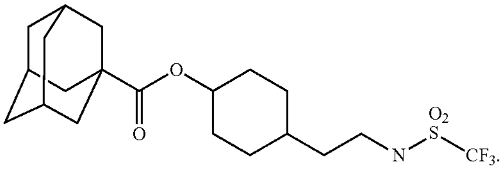

.

In some embodiments, the additive includes a formula (J1):

R—CN Formula (J1), and R is an aliphatic or aromatic group, unbranched or branched, cyclic or noncyclic saturated 1 to 24 carbon atoms. In some embodiments, the additive includes one of chemical formulae (J2) to (J8):

Formula (J2)

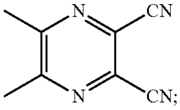

;

-continued

Formula (J3)

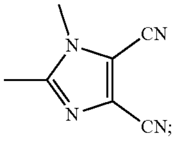

Formula (J4)

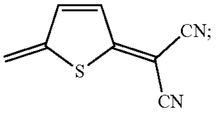

Formula (J5)

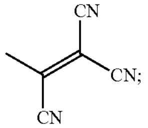

Formula (J6)

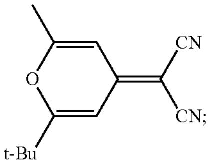

Formula (J7)

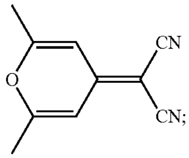

and

Formula (J8)

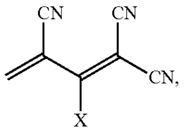

and wherein in the formula (J8), X is Phenyl, CN or $NH_2$.

In some embodiments, a method includes the following steps. A target layer is formed on a substrate. A resist layer is formed on the target layer. The resist layer is exposed. The resist layer is developed using a mixture including a developer and a first additive. The first additive and the developer include different compositions. The target layer is etched using the developed resist layer as a mask. In some embodiments, the mixture further includes a solvent including propylene glycol methyl ether acetate (PGMEA), propylene glycol monomethyl ether (PGME), 1-Ethoxy-2-propanol (PGEE), Gamma-Butyrolactone (GBL), Cyclohexanone (CHN), Ethyl lactate (EL), Methanol, Ethanol, Propanol, n-Butanol, Acetone, Dimethylformamide (DMF), Isopropyl alcohol (IPA), Tetrahydrofuran (THF), Methyl Isobutyl Carbinol (MIBC), n-butyl acetate (nBA), 2-heptanone (MAK), or a combination thereof. In some embodiments, the method further includes the following step. After developing the resist layer, a treatment is performed to the developed resist layer using a second additive, wherein the second additive includes a chemical formula having one or more double bonds.

In some embodiments, a resist for an electron-beam lithography or an extreme ultraviolet lithography includes a metallic resist having a core group surrounded by multiple ligands, and an additive having a composition different from a composition of the metallic resist.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a target layer on a substrate;

forming a resist layer on the target layer;

exposing the resist layer such that secondary electrons are produced in the resist layer;

terminating the secondary electrons using an additive, wherein the additive includes one of chemical formulae (A1) to (A6);

Formula (A1)

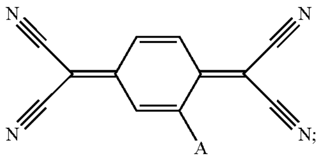

Formula (A2)

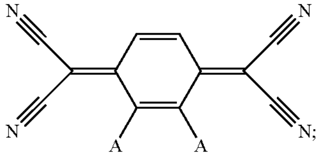

Formula (A3)

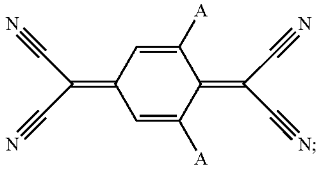

Formula (A4)

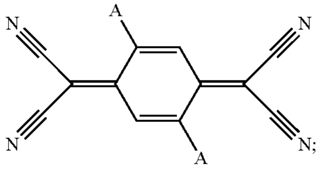

Formula (A5)

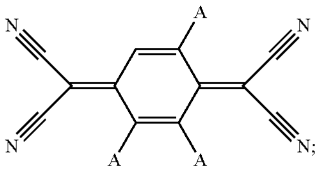

and

Formula (A6)

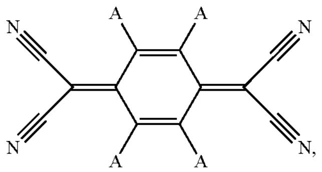

and wherein A in the Formulae (A1) to (A6) is H, F, Cl, R, or OR, and in the R and OR, R is composed by 1 to 12 carbon atoms;

developing the resist layer; and etching the target layer using the developed resist layer as a mask.

2. The method of claim 1, wherein the additive includes one of chemical formulae (B1) to (B4):

Formula (B1)

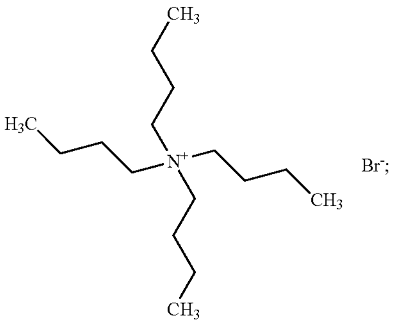

Tetra-n-butylammonium bromide (TBABr)

Formula (B2)

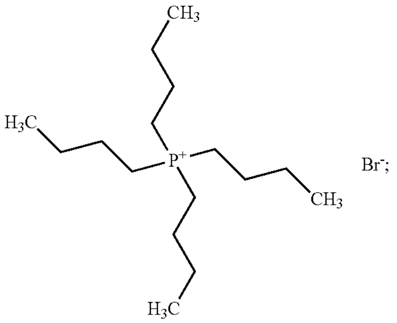

Tetrabutylphosphonium bromide (TBPBr)

Formula (B3)

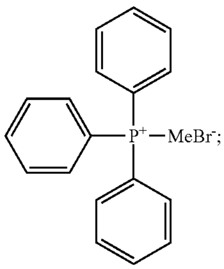

and

Methyltriphenylphosphonium bromide (mTPPBr)

Formula (B4)

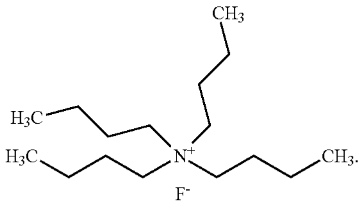

tetra-n-butylammonium fluoride (TABF)

3. The method of claim 1, wherein the additive includes a photo acid generator including a cation having one of chemical formulae (C1) and (C2):

Formula (C1)

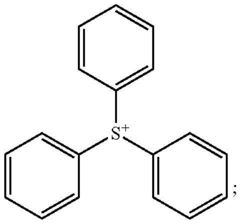

and

Formula (C2)

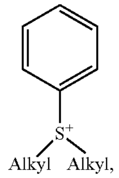

and an anion having one of chemical formulae (D1) to (D7):

$C_4F_9SO_3^-$ Formula (D1);

$C_6F_{13}SO_3^-$ Formula (D2);

Formula (D3)

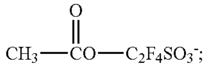

Formula (D4)

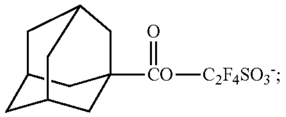

Formula (D5)

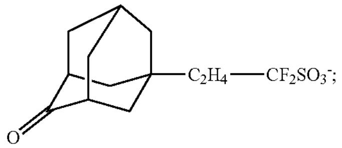

Formula (D6)

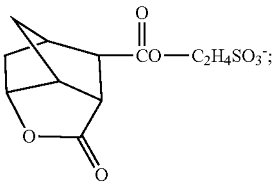

and

Formula (D7)

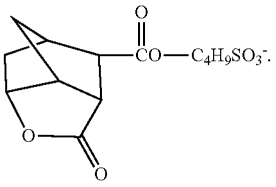

4. The method of claim 1, wherein the additive includes a formula (E1):

Formula (E1)

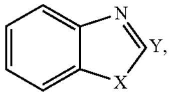

and wherein X in the Formula (E1) is N, NH or S, Y in the formula (E1) is S, O, Se, NH, NR, or R, in which R is 1 to 24 carbon units with hydrogen or halogen.

5. The method of claim 1, wherein the additive includes one of chemical formulae (E2) to (E9):

Formula (E2)

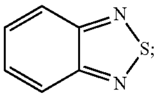

(benzothiadiazole)

Formula (E3)

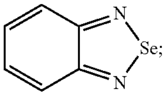

(benzoselenadiazole)

Formula (E4)

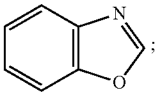

(benzoxazole)

Formula (E5)

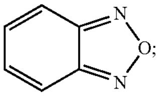

(benzofurazan)

Formula (E6)

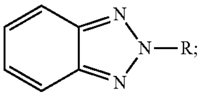

Formula (E7)

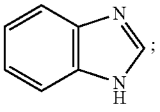

(benzimidazole)

Formula (E8)

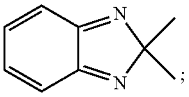

and

Formula (E9)

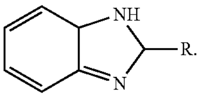

6. The method of claim 1, wherein the additive includes a chemical formula (E10):

Formula (E10)

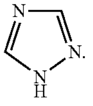

(triazole)

7. The method of claim 1, wherein the additive includes one of chemical formulae (E11) and (E12):

Formula (E11)

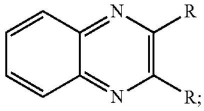

and

Formula (E12)

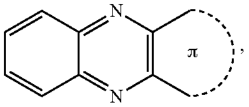

and wherein R in the formula (E11) is 1 to 24 carbon units with hydrogen or halogen.

8. The method of claim 1, wherein the additive includes one of chemical formulae (E13) and (E14):

Formula (E13)

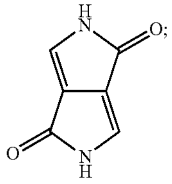

and (diketopyrrolopyrrole)

Formula (E14)

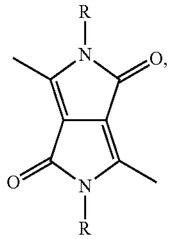

and wherein R in the formula (E14) is 1 to 24 carbon units with hydrogen or halogen.

9. The method of claim 1, wherein the additive includes a formula (F1):

Formula (F1)

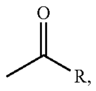

and wherein R in the Formula (F1) is an aliphatic or aromatic group, saturated 3 to 24 carbon atoms.

10. The method of claim 1, wherein the additive includes one of chemical formulae (F2) to (F9):

Formula (F2)

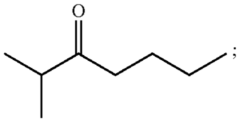

Formula (F3)

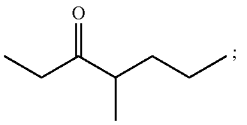

Formula (F4)

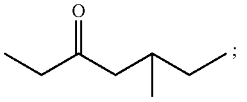

Formula (F5)

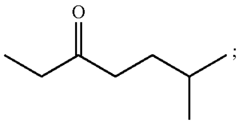

Formula (F6)

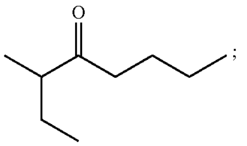

Formula (F7)

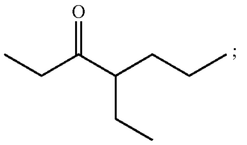

Formula (F8)

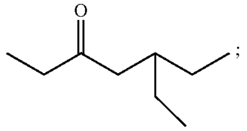

and

Formula (F9)

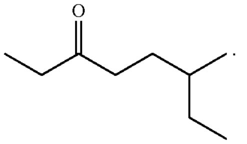

11. The method of claim 1, wherein the additive includes a formula (G1):

Formula (G1)

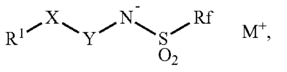

in which $R^1$ is an alicyclic group having 5 or more than 5 carbon atoms substituted with one or more substituents, X is a divalent linking group, Y is a linear, branched, or cyclic alkylene group, or an arylene group, Rf is a hydrocarbon group containing a fluorine atom, and $M^+$ is an organic cation or a metal cation.

12. The method of claim 11, wherein the $M^+$ is represented by chemical formulae (H1) or (H2):

Formula (H1)

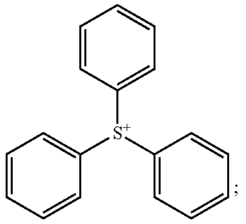

and

Formula (H2)

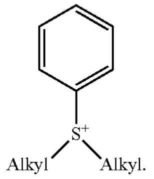

13. The method of claim 11, wherein an anion of the formula (G1) is represented by formulae (I1) to (I6):

Formula (I1)

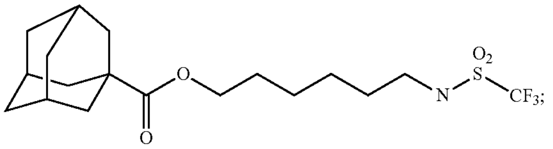

Formula (I2)

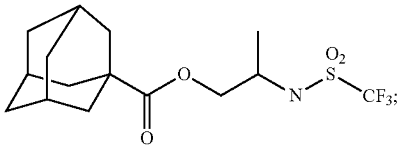

Formula (I3)

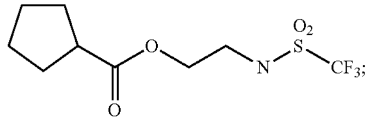

Formula (I4)

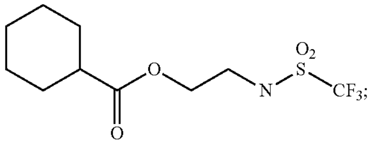

Formula (I5)

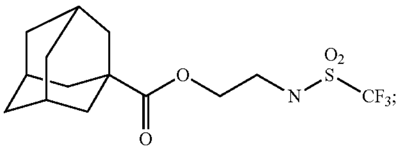

and

Formula (I6)

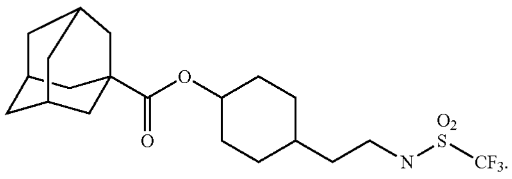

14. The method of claim 1, wherein the additive includes a formula (J1):

R—CN Formula (J1), and R is an aliphatic or aromatic group, saturated 1 to 24 carbon atoms.

15. The method of claim 1, wherein the additive includes one of chemical formulae (J2) to (J8):

Formula (J2)

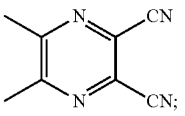

Formula (J3)

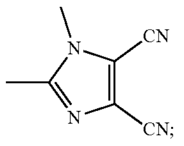

Formula (J4)

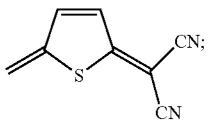

Formula (J5)

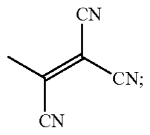

Formula (J6)

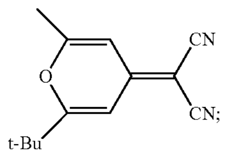

Formula (J7)

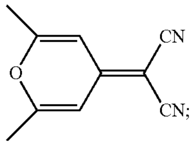

and

Formula (J8)

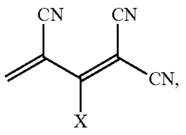

and wherein in the formula (J8), X is Phenyl, CN or $NH_2$.

16. A method, comprising:

forming a target layer on a substrate;

applying a first additive in gas phase to the target layer, wherein the first additive comprises one or more double bonds;

forming a resist layer on the target layer;

exposing the resist layer;

developing the resist layer using a mixture including a developer and a second additive, wherein the second additive and the developer include different compositions; and etching the target layer using the developed resist layer as a mask.

17. The method of claim 16, wherein the mixture further includes a solvent including propylene glycol methyl ether acetate (PGMEA), propylene glycol monomethyl ether (PGME), 1-Ethoxy-2-propanol (PGEE), Gamma-Butyrolactone (GBL), Cyclohexanone (CHN), Ethyl lactate (EL), Methanol, Ethanol, Propanol, n-Butanol, Acetone, Dimethylformamide (DMF), Isopropyl alcohol (IPA), Tetrahydrofuran (THF), Methyl Isobutyl Carbinol (MIBC), n-butyl acetate (nBA), 2-heptanone (MAK), or a combination thereof.

18. The method of claim 16, further comprising:

after developing the resist layer, performing a treatment to the developed resist layer using a third additive, wherein the third additive includes a chemical formula having one or more double bonds.

19. The method of claim 16, wherein exposing the resist layer comprises exposing the resist layer to an Extreme ultraviolet (EUV) radiation.

20. A method, comprising:

forming a target layer over a substrate;

applying an additive in gas phase to the target layer, wherein the additive comprises one or more double bonds;

forming a resist layer on the target layer;

exposing the resist layer;

developing the resist layer; and etching the target layer using the developed resist layer as a mask.

* * * * *